United States Patent
Thoppay Egambaram et al.

(10) Patent No.: US 10,574,287 B1
(45) Date of Patent: Feb. 25, 2020

(54) WIRELESS TRANSCEIVER WITH RECONFIGURABLE TRANSFORMERS

(71) Applicant: Qualcomm Incorporated, San Diego, CA (US)

(72) Inventors: Prakash Thoppay Egambaram, San Diego, CA (US); Ahmed Abbas Mohamed Helmy, San Diego, CA (US); Ojas Choksi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/147,092

(22) Filed: Sep. 28, 2018

(51) Int. Cl.
   *H04B 1/58* (2006.01)
   *H01F 27/42* (2006.01)
   *H04B 1/04* (2006.01)

(52) U.S. Cl.
   CPC ........... *H04B 1/581* (2013.01); *H01F 27/422* (2013.01); *H04B 2001/0408* (2013.01)

(58) Field of Classification Search
   CPC combination set(s) only.
   See application file for complete search history.

(56) References Cited

U.S. PATENT DOCUMENTS

| | | | |
|---|---|---|---|
| 8,743,575 B2 | 6/2014 | Nymand | |
| 8,929,945 B1* | 1/2015 | Wei | H04B 1/0057 330/165 |
| 9,912,305 B2 | 3/2018 | Matsuno | |
| 9,917,614 B1 | 3/2018 | Kang | |
| 2007/0018630 A1 | 1/2007 | Oehm | |
| 2007/0298731 A1 | 12/2007 | Zolfaghari | |
| 2009/0051609 A1 | 2/2009 | Packer et al. | |
| 2011/0068636 A1* | 3/2011 | Lee | H03K 17/693 307/115 |
| 2013/0012141 A1 | 1/2013 | Harnishfeger | |
| 2013/0281041 A1 | 10/2013 | Choksi et al. | |
| 2013/0316668 A1* | 11/2013 | Davierwalla | H03G 3/20 455/208 |
| 2015/0024695 A1 | 1/2015 | Wei et al. | |
| 2015/0147991 A1 | 5/2015 | Koroglu et al. | |
| 2015/0349741 A1 | 12/2015 | Lehtola et al. | |
| 2016/0076945 A1 | 3/2016 | Huang et al. | |
| 2016/0179124 A1 | 6/2016 | Madan et al. | |
| 2017/0250728 A1* | 8/2017 | Afsahi | H04B 1/44 |
| 2018/0006352 A1 | 1/2018 | Issakov et al. | |
| 2019/0326859 A1 | 10/2019 | Abbas et al. | |

FOREIGN PATENT DOCUMENTS

EP 3247041 11/2017

* cited by examiner

*Primary Examiner* — Junpeng Chen
(74) *Attorney, Agent, or Firm* — Colby Nipper

(57) ABSTRACT

An apparatus is disclosed that includes a wireless transceiver with reconfigurable transformers. In an example aspect, the wireless transceiver includes an amplifier, a set of transformers, and switch circuitry. The amplifier includes an amplifier input and an amplifier output. The set of transformers includes a first transformer and a second transformer. The first transformer includes a first inductor and a second inductor, and the second transformer also includes a first inductor and a second inductor. The switch circuitry is configured to switchably couple the set of transformers to the amplifier input and the amplifier output of the amplifier.

30 Claims, 11 Drawing Sheets

900

902
Selectively close or open a first switch to respectively connect or disconnect a first side of a first transformer to or from an amplifier input of a low-noise amplifier (LNA) of a wireless transceiver

904
Selectively close or open a second switch to respectively connect or disconnect the first side of the first transformer to or from an amplifier output of the LNA

906
Selectively close or open a third switch to respectively connect or disconnect a first side of a second transformer to or from the amplifier input of the LNA

908
Selectively close or open a fourth switch to respectively connect or disconnect the first side of the second transformer to or from the amplifier output of the LNA

FIG. 9

WIRELESS TRANSCEIVER WITH
RECONFIGURABLE TRANSFORMERS

TECHNICAL FIELD

This disclosure relates generally to wireless communications with electronic devices and, more specifically, to implementing with a wireless transceiver multiple transformers that can be reconfigured for input-matching or output-loading with respect to an amplifier.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, thermostats, automotive electronics, robotics, devices embedded in other machines like refrigerators and industrial tools, Internet of Things (IoT) devices, and so forth. These various electronic devices provide services relating to entertainment, social interaction, security, safety, productivity, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smart phone can transmit a wireless signal to a base station over an air medium as part of an uplink communication to support mobile services. Using a wireless receiver, the smart phone can receive a wireless signal from the base station via the air medium as part of a downlink communication to enable mobile services. With a smart phone, mobile services can include phone calls, video calls, social media interactions, text messaging, watching streamed movies, sharing videos, performing searches, obtaining map information or navigational instructions, and so forth.

Typically, electronic devices use a wireless transceiver to communicate via wireless signals in accordance with some wireless standard. Examples of wireless standards include an IEEE 802.11 Wi-Fi standard and a Fourth Generation (4G) cellular standard, both of which we use today with smartphones and other connected devices. However, efforts to enable a Fifth Generation (5G) wireless standard are ongoing. Next-generation 5G wireless networks are expected to offer significantly higher bandwidths, lower latencies, and access to additional electromagnetic spectrum. Taken together, this means that exciting new wireless technologies can be provided to users, such as driverless vehicles, augmented reality, on-the-go 4K video streaming, ubiquitous sensors to keep people safe and to use natural resources more efficiently, and so forth. To spread these new 5G technologies more widely, many wireless devices in addition to smart phones will be deployed, which is often called the "Internet of Things" (IoT). Compared to today's use of wireless devices, tens of billions, and eventually trillions, of more devices are expected to be connected to the internet with the arrival of the Internet of Things. These IoT devices may include small, inexpensive, and low-powered devices, like sensors and tracking tags.

To enable next-generation wireless technologies, 5G wireless devices will be communicating with signals that use wider frequency ranges and that span bands located at higher frequencies of the electromagnetic spectrum. As described above, many of these wireless devices—including smart phones and IoT devices—will be expected to be small, to be inexpensive, to consume low power, or some combination thereof. Thus, the components that enable wireless communications under these constraints will likewise be expected to be tiny, low cost, and capable of functioning with less energy use. One component that facilitates electronic communications is the wireless transceiver. Unfortunately, the wireless transceivers designed for devices that operate in accordance with the 4G wireless cellular standard are not adequate to handle the higher frequencies and more stringent expectations of 5G-capable devices.

Consequently, to facilitate the adoption of 5G technologies and the widespread deployment of wireless devices that can provide new capabilities, existing wireless transceivers will be replaced with those having superior designs that occupy less space or consume less power while still handling the higher frequencies of 5G networks. Electrical engineers and other designers of electronic devices are therefore striving to develop new wireless transceivers that will enable the promise of 5G technologies to become a reality.

SUMMARY

An electronic device having a wireless transceiver with reconfigurable transformers is disclosed herein. Example implementations of the disclosed reconfigurable transformers include switch circuitry coupled to a set of transformers so that an inductor of a transformer can function as an impedance-matching component to support input-matching for an amplifier in one circumstance and as an output load for the amplifier in another circumstance. This reconfigurability enables separate input inductors for the amplifier to be omitted from the wireless transceiver, which saves space and reduces cost for the electronic device.

In an example aspect, an apparatus with reconfigurable transformers is disclosed. The apparatus includes a set of transformers, an amplifier, and switch circuitry. The set of transformers includes a first transformer having a first side and a second side and a second transformer having a first side and a second side. The amplifier includes an amplifier input and an amplifier output. The switch circuitry couples the set of transformers to the amplifier. The switch circuitry includes a first switch, a second switch, a third switch, and a fourth switch. The first switch is coupled between the amplifier input and the first side of the first transformer. The second switch is coupled between the amplifier output and the first side of the first transformer. The third switch is coupled between the amplifier input and the first side of the second transformer. The fourth switch is coupled between the amplifier output and the first side of the second transformer.

In an example aspect, a system is disclosed. The system includes a set of transformers and a low-noise amplifier (LNA). The set of transformers includes a first transformer having a first side and a second side and a second transformer having a first side and a second side. The low-noise amplifier includes an amplifier input and an amplifier output. The system also includes switching means for selectively connecting the first side of the first transformer to the amplifier input or the amplifier output and for selectively connecting the first side of the second transformer to the amplifier input or the amplifier output.

In an example aspect, a method for operating a wireless transceiver with reconfigurable transformers is disclosed. The method includes selectively closing or opening a first switch to respectively connect or disconnect a first side of a first transformer to or from an amplifier input of a low-noise amplifier (LNA) of the wireless transceiver. The method also includes selectively closing or opening a second switch to respectively connect or disconnect the first side of the first transformer to or from an amplifier output of the low-noise amplifier. The method additionally includes selectively closing or opening a third switch to respectively connect or disconnect a first side of a second transformer to or from the amplifier input of the low-noise amplifier. The method further includes selectively closing or opening a fourth switch to respectively connect or disconnect the first side of the second transformer to or from the amplifier output of the low-noise amplifier.

In an example aspect, a wireless transceiver is disclosed. The wireless transceiver includes an amplifier, a set of transformers, and switch circuitry. The amplifier includes an amplifier input and an amplifier output. The set of transformers includes a first transformer and a second transformer. The first transformer includes a first inductor and a second inductor. The second transformer also includes a first inductor and a second inductor. The switch circuitry is configured to switchably couple the set of transformers to the amplifier input and the amplifier output of the amplifier.

BRIEF DESCRIPTION OF DRAWINGS

FIG. 7-1 is a circuit diagram of the wireless transceiver portion of FIG. 5 in an example first mode corresponding to a first frequency band with certain switches in associated switch states.

FIG. 7-2 is a circuit diagram of the wireless transceiver portion of FIG. 5 in an example second mode corresponding to a second frequency band with certain switches in associated switch states.

FIG. 7-3 is a circuit diagram of the wireless transceiver portion of FIG. 5 in an example third mode corresponding to a third frequency band with certain switches in associated switch states.

FIG. 9 is a flow diagram illustrating an example process for operating a wireless transceiver with reconfigurable transformers.

DETAILED DESCRIPTION

Figure 1:
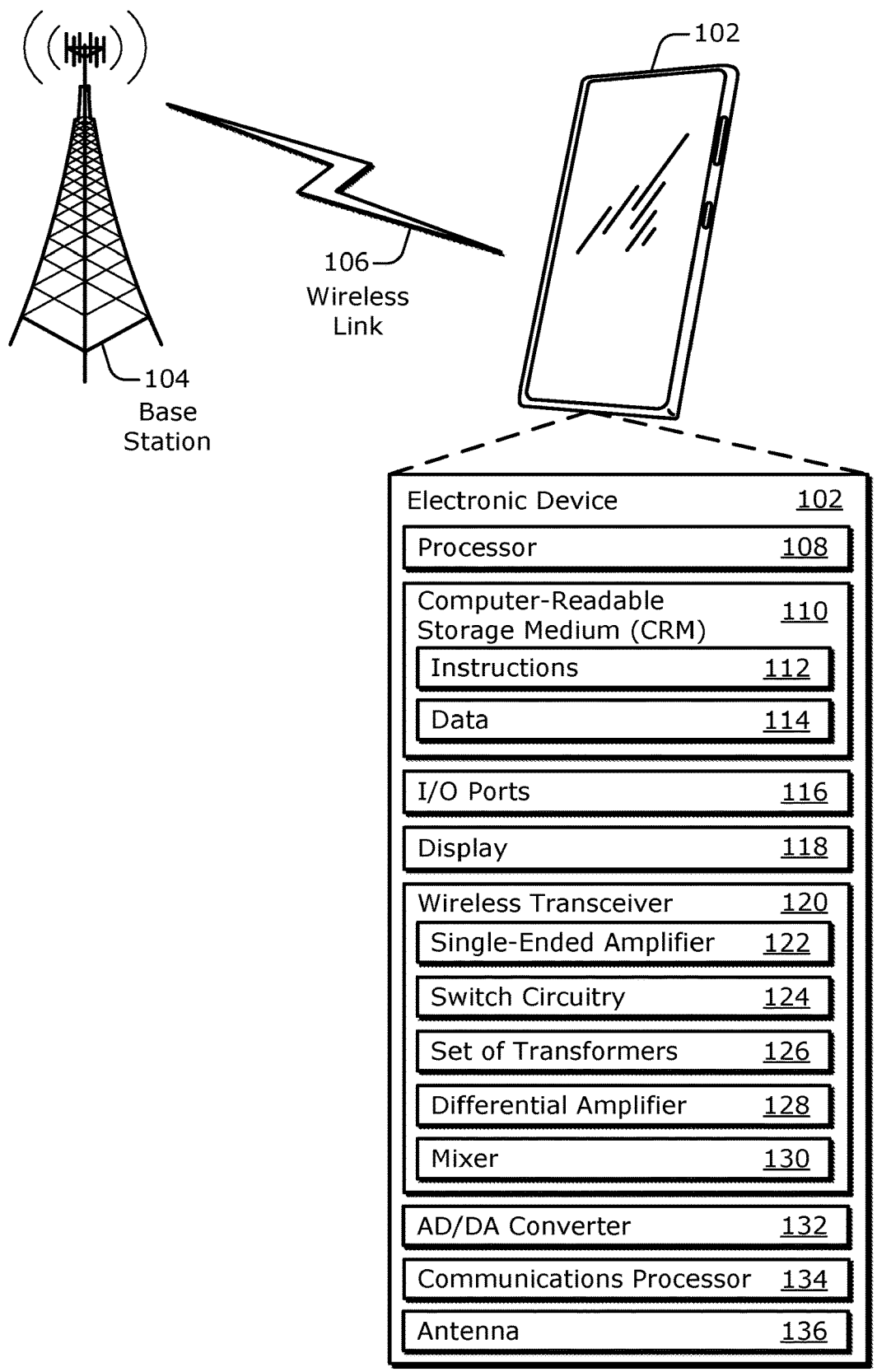
FIG. 1 illustrates an example environment that includes an electronic device in which a wireless transceiver with reconfigurable transformers can be implemented.

To provide today's mobile services, many electronic devices communicate via wireless signals using a transceiver. A transceiver can transmit or receive a wireless signal and includes a transmit chain or a receive chain (or both). Each transmit chain or receive chain may include at least one transformer that has a first side for a primary coil and a second side for a secondary coil, with each coil implemented as at least one inductor. A transformer can process or condition a signal that is propagating through a transmit or receive chain in different manners. For example, a transformer can change a voltage level of a signal that is propagated from the first side to the second side (e.g., from the primary coil to the secondary coil) or can physically isolate two portions of a circuit. Additionally, a transformer can be combined with a capacitive component to create an inductor-capacitor tank that is used to tune the propagating signal. Further, a transformer can convert a signal from having a single-ended format as a single-ended (SE) signal to having a differential format as a differential signal, or vice versa.

Electronic devices can be designed to support wideband wireless communications, such as those for 5th generation (5G) or 5G New Radio (NR) wireless systems. To enable signals to be transceived across a wide frequency range, some electronic devices use multiple transceivers. For an example receiving scenario, an overall receiver may be constructed from multiple narrowband receivers. Each narrowband receiver includes components that are designed for a specific, relatively-narrow frequency range portion of an overall wide frequency range. Each respective narrowband receiver may, for instance, utilize a respective filter that is designed to achieve certain performance specifications for the corresponding respective narrow frequency range. Because each of the multiple narrowband receivers utilize respective bandwidth-specific components, such as bandwidth-specific mixers or amplifiers, the bandwidth-specific components are repeated in multiple instances across the overall receiver. Consequently, the use of multiple narrowband receivers increases the area and cost of receiver circuitry employed in electronic devices. The situation is analogous for transmitter circuitry.

To reduce the number of components included in a transceiver circuit, while continuing to cover a wide frequency band, wideband components can be employed in lieu of duplicative narrowband components. The wideband components can be employed in, e.g., a receive chain or a transmit chain of a transceiver. However, creating a compact broadband implementation imposes challenges in the design of the transceiver, especially for the electromagnetic elements such as transformers and individual inductors that are more difficult to shrink as compared to active components that are formed from transistors.

In an example broadband receiver approach, three transformers are stacked in parallel. Each such transformer can have a fixed turns ratio between primary and secondary inductors and can cover a certain frequency range portion of an overall broadband frequency range. For instance, each of the three transformers can correspond to, and be tuned for, a first frequency range, a second frequency range, and a third frequency range (e.g., a low-band, a mid-band, or a high-band frequency range). Switches to selectively and independently activate each of the three transformers for a corresponding frequency range are positioned at both the input (e.g., at single-ended input lines) and the output (e.g., at differential output lines) of each transformer.

In some implementations, the transformer inputs are realized in a single-ended manner, and the transformer outputs are realized in a differential manner. An output of a broadband low-noise amplifier (LNA) of the receiver is coupled to the respective single-ended inputs of the three transformers. The broadband LNA can be used across the first, second, and third frequency ranges. The broadband LNA is coupled to at least one previous, or upstream, component along the receive chain, such as an antenna, another amplifier, a switch matrix, or an attenuator. An input of the broadband LNA is therefore impedance-matched to this previous component. To do so, the input of the LNA can be coupled to a separate, dedicated matching inductor to enable the LNA, or the overall receiver, to reduce reflections of incoming signals (e.g., for good S11 scattering parameter performance, with S11 characterizing an input reflection coefficient). Good reflection performance (e.g., low-input-signal reflection) enables a relatively constant gain across a targeted frequency range. However, the separate, dedicated impedance-matching inductor that is coupled to the input of the broadband LNA occupies a significant area. Especially with the sizes of active components that are formed from transistors continuing to decrease, the size occupied by this impedance-matching inductor appreciably increases the cost of the receiver, and of a transceiver generally.

To address this cost issue, a separate, dedicated impedance-matching inductor can be omitted from the input (or reduced in size at the input) of the broadband LNA, e.g. in a receive chain of a transceiver. In some implementations, this inductor can be omitted while still providing good input-matching characteristics for the transceiver. To do so, one of the transformers, e.g., of three transformers that are switchably coupled to the output of the LNA, can be selectively reconfigured to be coupled to the input of the LNA. In an example scenario, one of the three parallel-coupled transformers is activated at any given time to process a signal having a frequency that falls within a corresponding frequency band of the activated transformer. Thus, the other two transformers are available to be reconfigured for another purpose, such as for input-matching for the LNA. Herein, a currently-activated transformer is referred to as a main transformer for a corresponding frequency band, and the remaining transformers are referred to as auxiliary transformers for the corresponding frequency band.

Each of the three transformers includes a first side and a second side. In example operations, a transceiver controller operates switches coupled to the transformers. The transceiver controller places switches in an open state or a closed state to activate a main transformer to function as an output load for an amplifier, such as an LNA, for a corresponding frequency band of a signal being processed. The transceiver controller operates other switches to engage an auxiliary transformer to function like an input-matching inductor for this frequency band. To do so, the transceiver controller opens at least one switch that couples the first side of the auxiliary transformer to an output of the amplifier and closes at least one switch that couples the first side of the auxiliary transformer to the input of the amplifier. Thus, the transceiver controller is configured to selectively activate a given transformer as a output-loading transformer for the amplifier at one time for one frequency band and to selectively engage the given transformer as an input-matching transformer for the amplifier at another time for another frequency band. Although some example implementations are described in terms of receivers, the principles are also applicable to transmitters, and to transceivers generally.

In these manners, an inductor of a first side of a transformer can be "borrowed" to provide impedance-matching at an input of an amplifier while another transformer is activated to provide output-loading for the amplifier and to process a signal being received. A separate, dedicated inductor can therefore be omitted from being coupled to the input of the amplifier while the transceiver still maintains good impedance-matching and thus satisfactory signal input reflection performance. Alternatively, a relatively smaller inductor can be coupled to the input of the amplifier while the transceiver still maintains good impedance-matching and thus satisfactory signal input reflection performance. This is accomplished, from a component count perspective, by replacing a separate dedicated inductor with a switch that is coupled between the input of the amplifier and the first side of the transformer. Because the switch can be significantly smaller than the dedicated inductor (e.g., by implementing the switch with a transistor), the size and cost of the transceiver circuitry is reduced.

FIG. 1 illustrates an example environment 100 that includes an electronic device 102 with a wireless transceiver 120 in which reconfigurable transformers can be implemented. In the environment 100, the electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, access point, peer to peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

As shown, the electronic device 102 includes a processor 108 and a computer readable storage medium 110 (CRM 110). The processor 108 may include any type of processor, such as an application processor or a multi-core processor, that is configured to execute processor-executable instructions (e.g., code) stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include input/output ports 116 (I/O ports 116) or a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a screen or projection that presents graphics provided by the electronic device 102, such as a user interface associated with an operating system, program, or application. Alternatively or additionally, the display 118 may be implemented as a display port or virtual interface through which graphical content of the electronic device 102 is communicated or presented.

For communication purposes, the electronic device 102 also includes at least one wireless transceiver 120, at least one analog-to-digital or digital-to-analog converter 132 (AD/DA converter 132), at least one communications processor 134, and at least one antenna 136. The wireless transceiver 120 provides connectivity to respective networks and other electronic devices connected therewith using radio-frequency (RF) wireless signals. Additionally or alternatively, the electronic device 102 may include a wired transceiver, such as an Ethernet or fiber optic interface for communicating over a personal or local network, an intranet, or the Internet. The wireless transceiver 120 may facilitate communication over any suitable type of wireless network, such as a wireless local area network (LAN) (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), a wireless personal area network (WPAN), or some combination thereof. In the context of the example environment 100, the wireless transceiver 120 enables the electronic device 102 to communicate with the base station 104 and networks connected therewith. However, the wireless transceiver 120 can enable the electronic device 102 to communicate with other devices or using alternative wireless networks.

Generally, the wireless transceiver 120 includes circuitry, logic, or other hardware for transmitting or receiving a wireless signal for at least one communication frequency band. For example, the wireless transceiver 120 can implement at least one, e.g., radio frequency (RF) transceiver to process data and/or signals associated with communicating data of the electronic device 102 via the antenna 136. The AD/DA converter 132 can be coupled between the wireless transceiver 120 and the communications processor 134. The AD/DA converter 132 performs analog-to-digital conversion (ADC) or digital-to-analog conversion (DAC) for downlink signals and uplink signals, respectively. The wireless transceiver 120 may include or may be associated with the communications processor 134. The communications processor 134, such as a baseband modem, may be implemented as a system on-chip (SoC) that provides a digital communication interface for data, voice, messaging, and other applications of the electronic device 102.

Thus, the communications processor 134 may include baseband circuitry to perform high-rate sampling processes that can include analog-to-digital conversion (ADC), digital-to-analog conversion (DAC), gain correction, skew correction, frequency translation, and so forth. The communications processor 134 may also include logic to perform in-phase/quadrature (I/Q) operations, such as synthesis, encoding, modulation, demodulation, and decoding. A communications processor 134 may generally be realized as a modem, as a digital signal processor (DSP), or as a communications-oriented processing unit that is configured to perform signal processing to support communications via one or more networks. Alternatively, ADC or DAC operations may be performed by a separate component, such as the AD/DA converter 132.

Generally, the wireless transceiver 120 can include filters, switches, amplifiers, mixers, and so forth for routing and conditioning signals that are transmitted or received via the antenna 136. As shown, the wireless transceiver 120 includes at least one single-ended amplifier 122, switch circuitry 124, at least one set of transformers 126, at least one differential amplifier 128, and at least one mixer 130. In some implementations, the single-ended amplifier 122, which amplifies a strength of a signal, is coupled to the antenna 136. Thus, the single-ended amplifier 122 can couple a wireless signal to or from the antenna 136 in addition to increasing a strength of the signal. The set of transformers 126 includes multiple transformers (not separately shown in FIG. 1). In some implementations, the switch circuitry 124 can switchably couple individual transformers of the set of transformers 126 to the single-ended amplifier 122. The set of transformers 126 provides a physical or electrical separation between the single-ended amplifier 122 and other circuitry of the wireless transceiver 120. The set of transformers 126 also conditions a signal propagating through the set of transformers 126 and further couples the propagating signal to the differential amplifier 128.

The differential amplifier 128, like the single-ended amplifier 122, reinforces a strength of a propagating signal. The wireless transceiver 120 can further perform frequency conversion using a synthesized signal and the mixer 130. The mixer 130 may include an upconverter and/or a downconverter that performs frequency conversion in a single conversion step, or through multiple conversion steps. The wireless transceiver 120 may also include logic (not shown) to perform in-phase/quadrature (I/Q) operations, such as synthesis, encoding, modulation, demodulation, and decoding using a synthesized signal.

In some cases, components of the wireless transceiver 120 are implemented as at least partially separate receiver and transmitter entities. Additionally or alternatively, the wireless transceiver 120 can be realized using multiple or different sections to implement respective receiving and transmitting operations (e.g., using separate transmit and receive chains). Example operations of, as well as interactions between, the illustrated components of the wireless transceiver 120 are described with reference to FIG. 2. The descriptions of FIGS. 3 and 4 pertain to example implementations of the single-ended amplifier 122 and the set of transformers 126 as selectively coupled together by the switch circuitry 124. FIGS. 5 and 7-1 to 7-3 depict at a circuit level different example modes of a wireless transceiver portion with reconfigurable transformers. Thus, as described herein, the wireless transceiver 120 can implement reconfigurable transformers with the set of transformers 126 and the switch circuitry 124.

Figure 2:
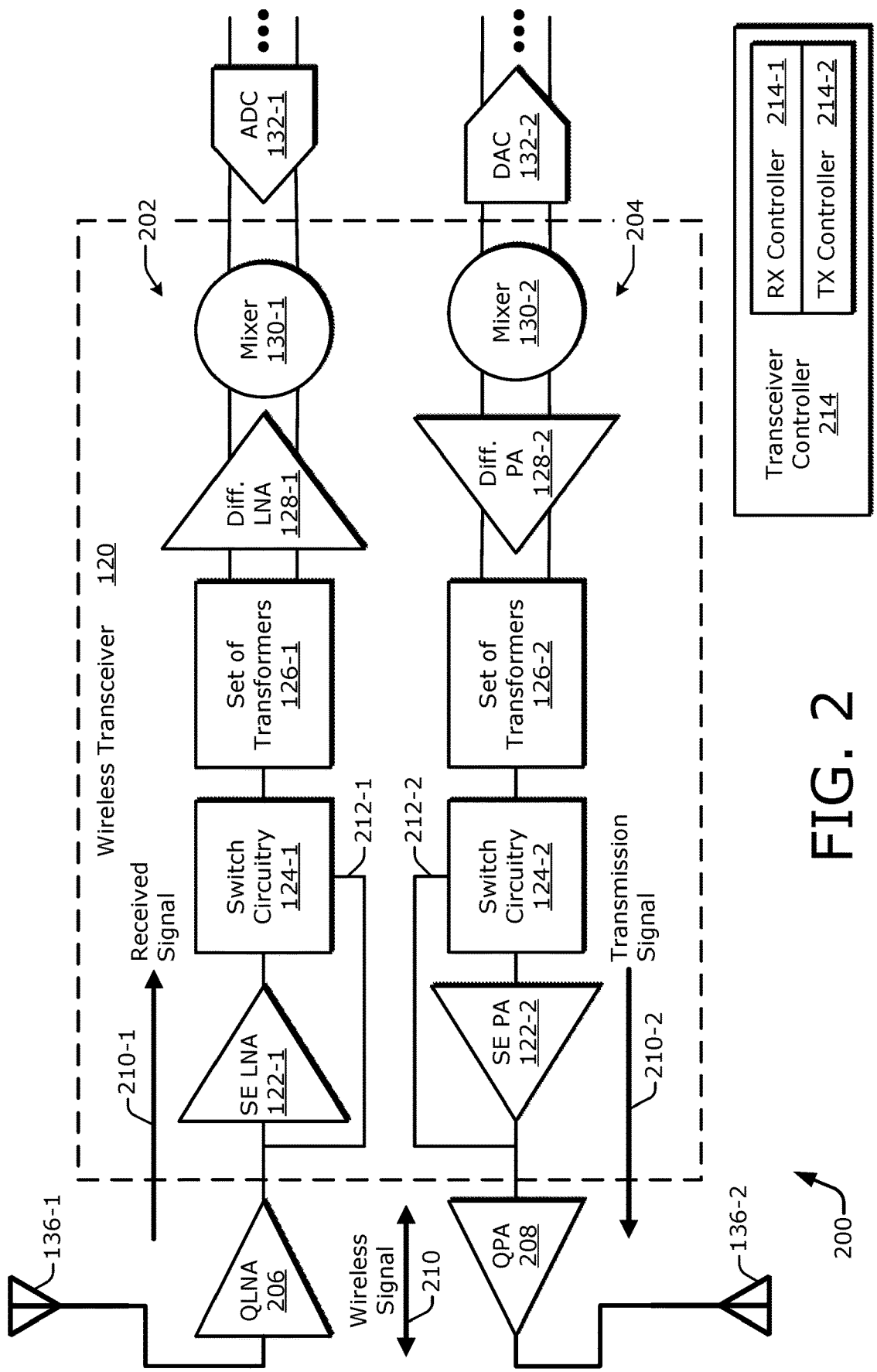
FIG. 2 illustrates an example wireless transceiver having at least one set of transformers that includes multiple transformers that can be reconfigured.

FIG. 2 illustrates generally at 200 an example wireless transceiver 120 including a receive chain 202 and a transmit chain 204 that each have switch circuitry 124 and a set of transformers 126 to implement transformer reconfiguration. The example receive chain 202 is depicted in the upper half of the wireless transceiver 120, and the example transmit chain 204 is depicted in the lower half. Each of the receive chain 202 and the transmit chain 204 is coupled to at least one antenna 136 to enable a wireless signal 210 to be received or transmitted, respectively. The wireless signal 210 can include a received signal 210-1 or a transmission signal 210-2. As illustrated, the receive chain 202 is coupled to an antenna 136-1 via a quadrature low-noise amplifier 206 (QLNA 206). The transmit chain 204 is coupled to an antenna 136-2 via a quadrature power amplifier 208 (QPA 208).

Although the receive chain 202 and the transmit chain 204 are shown coupled to two different antennas 136-1 and 136-2, the chains may instead be coupled to multiple antennas, to the same one or more antennas, to at least one antenna array, and so forth. Further, although a particular set of components in a particular order are illustrated in FIG. 2 and described herein, each of the receive chain 202 or the transmit chain 204 may include different components, different combinations of components, different orders of components, alternative interconnections, and so forth. Additionally, the receive chain 202 and the transmit chain 204 may share one or more components, such as an antenna array, a switch matrix, or a local oscillator (LO).

In example implementations, the receive chain 202 processes a received signal 210-1 that is obtained via the antenna 136-1 and the quadrature low-noise amplifier 206. The receive chain 202 includes, from left-to-right, a single-ended low-noise amplifier 122-1 (SE LNA 122-1), switch circuitry 124-1, a set of transformers 126-1, a differential low-noise amplifier 128-1 (Diff. LNA 128-1), a mixer 130-1, and an analog-to-digital converter 132-1 (ADC 132-1). As indicated by the ellipses (" . . . ") depicted on the right of FIG. 2, the receive chain 202 can continue processing the received signal 210-1, e.g., using intermediate frequency (IF) circuitry or baseband circuitry (not explicitly indicated in FIG. 2), such as the communications processor 134 of FIG. 1. Although the amplifier coupled to the switch circuitry 124-1 is depicted as a single-ended amplifier (e.g., the single-ended low-noise amplifier 122-1), this amplifier may alternatively comprise a differential amplifier that provides to the switch circuitry 124-1 a differential signal having a plus component and a minus component.

In an example operation, the single-ended low-noise amplifier 122-1 amplifies the received signal 210-1 and provides the amplified received signal 210-1 to the set of transformers 126-1 via the switch circuitry 124-1. The set of transformers 126-1 includes two or more transformers. Here, the set of transformers 126-1 provides isolation between different portions of the wireless transceiver 120 and converts the single-ended received signal 210-1 into a double-ended, differential received signal 210-1. The set of transformers 126-1 can further condition the received signal 210-1, such as by altering a voltage level of the received signal 210-1, tuning the received signal 210-1 (e.g., using an inductor and a capacitor coupled together as an LC tank), and so forth.

As described with reference to FIG. 3 et seq., the switch circuitry 124-1 can couple individual transformers of the set of transformers 126-1 to an amplifier output of the single-ended low-noise amplifier 122-1 to function as an output load or to an amplifier input of the single-ended low-noise amplifier 122-1 to function as an impedance-matching component. The switchable coupling capability that is disposed between at least one transformer of the set of transformers 126-1 and the amplifier input of the single-ended low-noise amplifier 122-1 is represented by a coupling 212-1. This selective reconfiguration of the transformers of the wireless transceiver 120 enables at least one transformer to provide variable functionality in different modes for different frequency bands at various times.

The set of transformers 126-1 passes the conditioned, differential received signal 210-1 from at least one transformer thereof to the differential low-noise amplifier 128-1 to be amplified. After the differential low-noise amplifier 128-1 increases a signal strength of the received signal 210-1, the mixer 130-1 mixes a reference signal produced by a local oscillator (not shown) with the amplified received signal 210-1 to down-convert the received signal 210-1 from one frequency to a lower frequency, such as from a radio frequency (RF) to an intermediate frequency (IF) or from an intermediate frequency to a baseband (BB) frequency (or directly from RF to BB frequency). The down-converted received signal 210-1 is passed out of the wireless transceiver 120 to the analog-to-digital converter 132-1, which converts the analog information encoded in the received signal 210-1 into digital information. The analog-to-digital converter 132-1 can then forward the received signal 210-1 in a digital format to additional IF or BB components for further processing.

In example implementations, the transmit chain 204 operates in a manner that is analogous to that of the receive chain 202, but in an opposite direction and on a transmission signal 210-2. The transmit chain 204 includes, from right-to-left, a digital-to-analog converter 132-2 (DAC 132-2), a mixer 130-2, a differential power amplifier 128-2 (Diff. PA 128-2), a set of transformers 126-2, switch circuitry 124-2, and a single-ended power amplifier 122-2 (SE PA 122-2). Although the amplifier coupled to the switch circuitry 124-2 is depicted as a single-ended amplifier (e.g., the single-ended power amplifier 122-2), this amplifier may alternatively comprise a differential amplifier that receives from the switch circuitry 124-2 a differential signal having a plus component and a minus component. In operation, the digital-to-analog converter 132-2 receives a digital version of the transmission signal 210-2 from baseband circuitry, such as from the communications processor 134 of FIG. 1, and converts the transmission signal 210-2 to an analog version thereof. The mixer 130-2 upconverts the analog transmission signal 210-2, and the differential power amplifier 128-2 amplifies the upconverted transmission signal 210-2 to produce an amplified transmission signal 210-2.

The amplified transmission signal 210-2 is applied in a differential mode to the set of transformers 126-2. The set of transformers 126-2 includes two or more transformers. The set of transformers 126-2 converts the transmission signal 210-2 from the differential mode to a single-ended mode and can also condition the transmission signal 210-2. The set of transformers 126-2 provides the conditioned, single-ended transmission signal 210-2 to the single-ended power amplifier 122-2 via the switch circuitry 124-2. The switch circuitry 124-2 can couple individual transformers of the set of transformers 126-2 to an amplifier output of the single-ended power amplifier 122-2 to function as an output load or to an amplifier input of the single-ended power amplifier 122-2 to function as an impedance-matching component. The switchable coupling capability that is disposed between at least one transformer of the set of transformers 126-2 and the amplifier output of the single-ended power amplifier 122-2 is represented by a coupling 212-2. This selective reconfiguration of the transformers of the wireless transceiver 120 enables at least one transformer to provide variable functionality in different modes for different frequency bands at various times. After amplification, the single-ended power amplifier 122-2 provides an amplified transmission signal 210-2 to the quadrature power amplifier 208 for subsequent electromagnetic emanation from the antenna 136-2.

Operation of the wireless transceiver 120 can be at least partially controlled by a transceiver controller 214. The communications processor 134 of FIG. 1, for example, can include the transceiver controller 214. As shown, the transceiver controller 214 includes a receiver controller 214-1 (RX Controller 214-1) and a transmitter controller 214-2 (TX Controller 214-2). The receiver controller 214-1 controls operation of the receive chain 202, and the transmitter controller 214-2 controls operation of the transmit chain 204. Thus, the receiver controller 214-1 can control operation of the switch circuitry 124-1 to reconfigure transformers of the set of transformers 126-1 for input impedance-matching or output-loading with respect to the single-ended low-noise amplifier 122-1. Similarly, the transmitter controller 214-2 can control operation of the switch circuitry 124-2 to reconfigure transformers of the set of transformers 126-2 for input impedance-matching or output-loading with respect to the single-ended power amplifier 122-2. Much of the description below focuses on structure, operation, and control of the single-ended low-noise amplifier 122-1, the switch circuitry 124-1, and the set of transformers 126-1 of the receive chain 202. However, the described principles are likewise applicable to structure, operation, and control of the single-ended power amplifier 122-2, the switch circuitry 124-2, and the set of transformers 126-2 of the transmit chain 204.

Figure 3:
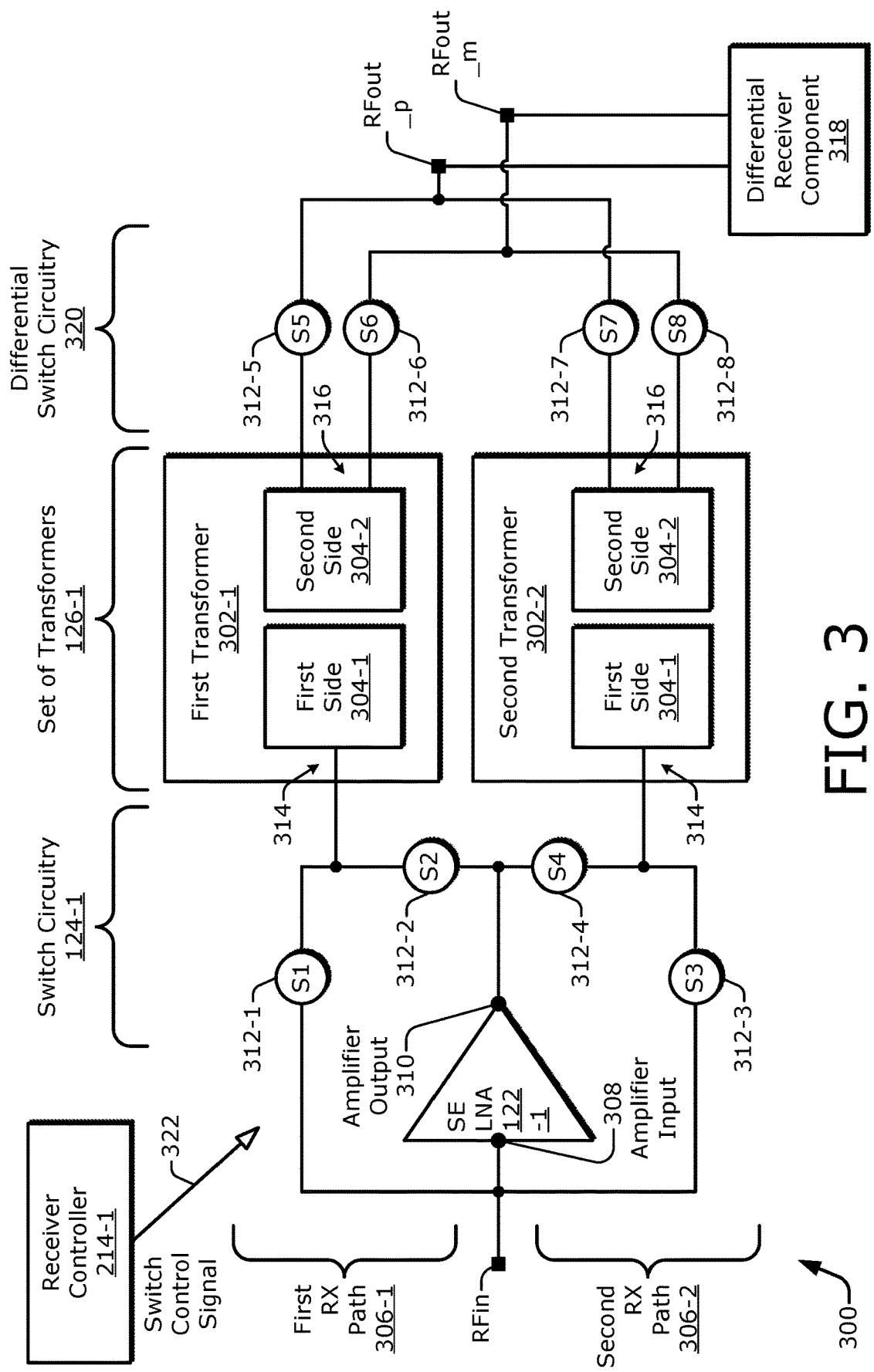
FIG. 3 is a schematic diagram illustrating an example wireless transceiver portion including an amplifier, switch circuitry, a set of transformers with two transformers, and differential switch circuitry, as well as a receiver controller.

FIG. 3 is a schematic diagram illustrating an example wireless transceiver portion 300 including an amplifier (e.g., the single-ended low-noise amplifier 122-1), switch circuitry 124-1, a set of transformers 126-1, and differential switch circuitry 320. The schematic diagram also includes a receiver controller 214-1 and a differential receiver component 318. The set of transformers 126-1 includes multiple transformers, which is two transformers in this example: a first transformer 302-1 and a second transformer 302-2.

Each transformer 302 includes a first side 304-1 and a second side 304-2. Each side 304 can include at least one inductor, as explicitly depicted in FIG. 5. As used herein, the first side 304-1 and the second side 304-2 of a given transformer 302 may respectively correspond to a primary side or "coil" and a secondary side or "coil" or may respectively correspond to a secondary side or "coil" and a primary side or "coil." From a physical perspective, the first side 304-1 and the second side 304-2 of a given transformer 302 may correspond to a right portion and a left portion (or vice versa) or a top portion and a bottom portion (or vice versa) of the given transformer 302. Further, from a three-dimensional circuit-fabrication perspective, the first side 304-1 and the second side 304-2 of a given transformer 302 may correspond to a relatively higher metal layer or layers and a relatively lower metal layer or layers (or vice versa). Thus, an inductor of one side may be physically disposed at least partially over or above another inductor of another side.

In example implementations with the receive chain 202 of FIG. 2, the amplifier is implemented as the single-ended low-noise amplifier 122-1 as shown in FIG. 3. The single-ended low-noise amplifier 122-1 includes an amplifier input 308 and an amplifier output 310. The wireless transceiver portion 300 has a single-ended input and a differential output. The single-ended input includes a radio-frequency input "RFin." The differential output includes a plus RF output "RFout_p" and a minus RF output "RFout_m." The single-ended low-noise amplifier 122-1, the switch circuitry 124-1, the set of transformers 126-1, and the differential switch circuitry 320 are coupled together between the single-ended input RFin and the differential outputs RFout_p and RFout_m. The differential receiver component 318 is coupled to the plus RF output "RFout_p" and the minus RF output "RFout_m." The differential receiver component 318 can be realized as, for example, a differential amplifier, a differential mixer, a differential filter, and so forth.

As shown, the switch circuitry 124-1 includes four switches: a first switch 312-1, a second switch 312-2, a third switch 312-3, and a fourth switch 312-4. The differential switch circuitry 320 includes four switches: a fifth switch 312-5, a sixth switch 312-6, a seventh switch 312-7, and an eighth switch 312-8. The receiver controller 214-1 generates a switch control signal 322. The switch control signal 322 controls a switch state of each switch 312. Each switch 312 can be in an open state or a closed state. Each switch 312 can be implemented using, for example, a transistor that is turned on for the closed switch state and is turned off for the open switch state. A transistor can be realized using, for instance, a metal-oxide-semiconductor (MOS) field-effect transistor (FET), or MOSFET. Thus, the switch control signal 322 can be coupled to a gate terminal of a MOSFET to bias the transistor into an on state or an off state to close or open a switch, respectively.

As illustrated in FIG. 3, an example transformer stage for a receive chain includes multiple receive paths. Here, there are two receive paths: a first receive path 306-1 (First RX Path 306-1) and a second receive path 306-2 (Second RX Path 306-2). In example implementations, the single-ended low-noise amplifier 122-1 is realized as a broadband amplifier that can process signals across multiple frequency bands. In contrast, each respective receive path 306 can correspond to a respective frequency band. The first receive path 306-1 includes the first transformer 302-1 having two sides 304: a first side 304-1 and a second side 304-2. The second receive path 306-2 includes the second transformer 302-2 having two sides 304: a first side 304-1 and a second side 304-2. Each side 304 can include at least one inductor, which is explicitly shown in FIG. 5. Each transformer 302 includes a single-ended interface 314 at the first side 304-1 and a differential interface 316 at the second side 304-2.

The first and second receive paths 306-1 and 306-2 are coupled in parallel with each other between the single-ended input RFin and the differential outputs RFout_p and RFout_m. The single-ended input RFin is coupled to the amplifier input 308 of the single-ended low-noise amplifier 122-1. The set of transformers 126-1 is switchably coupled to the amplifier input 308 and the amplifier output 310 of the single-ended low-noise amplifier 122-1 via the switch circuitry 124-1. More specifically, the first switch 312-1 is coupled between the amplifier input 308 and the first side 304-1 of the first transformer 302-1, and the second switch 312-2 is coupled between the amplifier output 310 and the first side 304-1 of the first transformer 302-1. Further, the third switch 312-3 is coupled between the amplifier input 308 and the first side 304-1 of the second transformer 302-2, and the fourth switch 312-4 is coupled between the amplifier output 310 and the first side 304-1 of the second transformer 302-2.

The differential outputs RFout_p and RFout_m are coupled to the differential receiver component 318. The set of transformers 126-1 is switchably coupled to the differential outputs RFout_p and RFout_m via the differential switch circuitry 320. More specifically, the fifth switch 312-5 is coupled between the plus RF output "RFout_p" and the second side 304-2 of the first transformer 302-1, and the sixth switch 312-6 is coupled between the minus RF output "RFout_m" and the second side 304-2 of the first transformer 302-1. Further, the seventh switch 312-7 is coupled between the plus RF output "RFout_p" and the second side 304-2 of the second transformer 302-2, and the eighth switch 312-8 is coupled between the minus RF output "RFout_m" and the second side 304-2 of the second transformer 302-2.

Although not explicitly shown, the receiver controller 214-1 is coupled to the multiple switches 312-1 to 312-8 to enable the receiver controller 214-1 to open and close the multiple switches via the switch control signal 322. The switch circuitry 124-1 includes multiple switches 312-1 to 312-4 coupled between first sides of the multiple transformers and the amplifier input 308 or the amplifier output 310 of the single-ended low-noise amplifier 122-1. Thus, the switch circuitry 124-1 can provide an example switching mechanism for selectively connecting the first side 304-1 of the first transformer 302-1 to the amplifier input 308 or the amplifier output 310 and for selectively connecting the first side 304-1 of the second transformer 302-2 to the amplifier input 308 or the amplifier output 310.

In an example operation, a received wireless signal has a frequency within a frequency band corresponding to the second receive path 306-2. Thus, the received signal is to propagate along the second receive path 306-2 and be processed by the second transformer 302-2 prior to being forwarded to a downstream component, such as the differential receiver component 318. The receiver controller 214-1 operates the multiple switches 312-1 to 312-8 based on the received signal having a frequency that matches a frequency band corresponding to the second transformer 302-2 for the second receive path 306-2. The receiver controller 214-1 establishes switch states of the multiple switches 312-1 to 312-8 to route the received signal along the second receive path 306-2.

Responsive to the frequency of the received wireless signal and based on the corresponding frequency bands of the respective receive paths, the receiver controller 214-1 therefore activates the second transformer 302-2 to function as a main transformer, and the receiver controller 214-1 engages the first transformer 302-1 to function as an auxiliary transformer. The second transformer 302-2 therefore operates as a load transformer for the single-ended low-noise amplifier 122-1 and receives an amplified signal from the amplifier output 310 of the single-ended low-noise amplifier 122-1. Thus, the receiver controller 214-1 can provide an example control mechanism for configuring the first transformer 302-1 and the second transformer 302-2 in multiple modes corresponding to multiple frequency bands using at least the switch circuitry 124-1. Example modes are described further with reference to FIG. 6.

In this configuration in which the received wireless signal has a frequency within a frequency band corresponding to the second receive path 306-2, the second transformer 302-2 processes the amplified signal by, for instance, converting the amplified signal from single-ended signaling to differential signaling. The first transformer 302-1, on the other hand, "loans" an inductance (e.g., at least an inductance of a coil corresponding to the first side 304-1 thereof) to the wireless transceiver to provide input impedance-matching at the amplifier input 308 of the single-ended low-noise amplifier 122-1. In these manners, an auxiliary transformer that is not currently activated for processing a received signal can be reconfigured to provide impedance-matching without relying on a separate, dedicated inductor.

To implement this scenario, the receiver controller 214-1 is configured to operate the multiple switches in the following manner. The receiver controller 214-1 closes the first switch 312-1 to connect the first side 304-1 of the first transformer 302-1 to the amplifier input 308 of the single-ended low-noise amplifier 122-1 (e.g., at the single-ended input RFin). The receiver controller 214-1 also opens the second switch 312-2 to disconnect this first side 304-1 of the first transformer 302-1 from the amplifier output 310. With respect to the second receive path 306-2, the receiver controller 214-1 closes the fourth switch 312-4 to connect the first side 304-1 of the second transformer 302-2 to the amplifier output 310 of the single-ended low-noise amplifier 122-1. The third switch 312-3 is opened to disconnect this first side 304-1 of the second transformer 302-2 from the amplifier input 308. For the differential switch circuitry 320, the receiver controller 214-1 also opens the fifth and sixth switches 312-5 and 312-6 and closes the seventh and eighth switches 312-7 and 312-8 to route the received signal from the second side 304-2 of the second transformer 302-2 to the differential outputs RFout_p and RFout_m.

Figure 4:
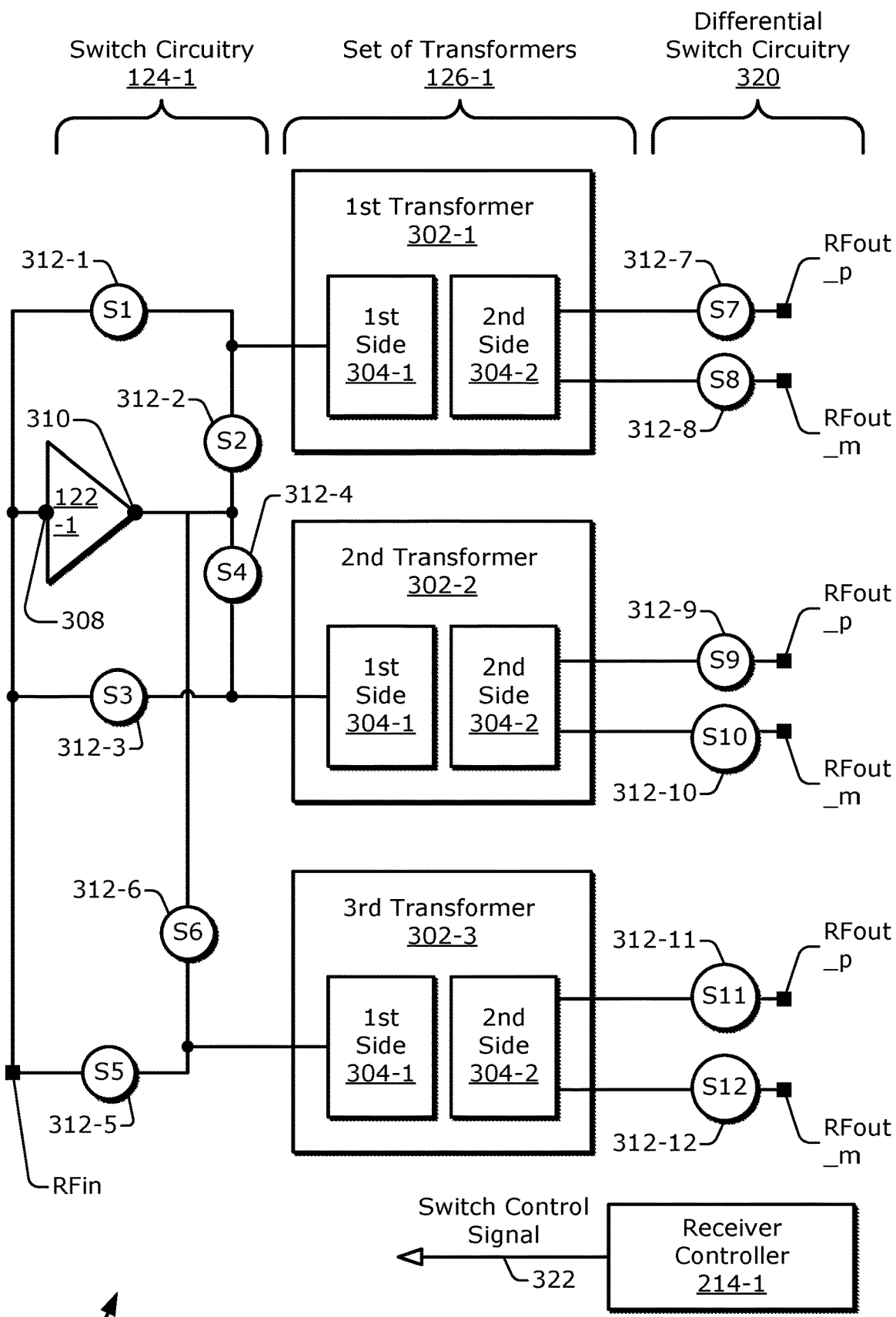
FIG. 4 is a schematic diagram illustrating another example wireless transceiver portion including a set of transformers with three transformers, as well as a receiver controller.

FIG. 4 is a schematic diagram illustrating another example wireless transceiver portion 400 including a set of transformers 126-1 with three transformers 302-1, 302-2, and 302-3. In this implementation, the switch circuitry 124-1 includes six switches: a first switch 312-1, a second switch 312-2, a third switch 312-3, a fourth switch 312-4, a fifth switch 312-5, and a sixth switch 312-6. The differential switch circuitry 320 also includes six switches: a seventh switch 312-7, an eighth switch 312-8, a ninth switch 312-9, a tenth switch 312-10, an eleventh switch 312-11, and a twelfth switch 312-12. The receiver controller 214-1 generates a switch control signal 322. The switch control signal 322 controls a switch state of each switch 312—e.g., an open switch state or a closed switch state.

The first transformer 302-1 is associated with four switches to deactivate/disengage the transformer for a given frequency band, activate the transformer for signal processing and output-loading with respect to the single-ended low-noise amplifier 122-1, or engage the transformer for impedance-matching with respect to the single-ended low-noise amplifier 122-1. The first switch 312-1 is coupled between the amplifier input 308 and the first side 304-1 of the first transformer 302-1, and the second switch 312-2 is coupled between the amplifier output 310 and this first side 304-1. The seventh switch 312-7 and the eighth switch 312-8 are coupled between the second side 304-2 of the first transformer 302-1 and the plus and minus differential outputs RFout_p and RFout_m, respectively.

The second transformer 302-2 is associated with four switches for deactivating or disengaging the transformer, activating the transformer for output-loading, or engaging the transformer for impedance-matching. The third switch 312-3 is coupled between the amplifier input 308 and the first side 304-1 of the second transformer 302-2, and the fourth switch 312-4 is coupled between the amplifier output 310 and this first side 304-1. The ninth switch 312-9 and the tenth switch 312-10 are coupled between the second side 304-2 of the second transformer 302-2 and the plus and minus differential outputs RFout_p and RFout_m, respectively.

The third transformer 302-3 is also associated with four switches to deactivate/disengage the transformer, activate the transformer for output-loading, or engage the transformer for impedance-matching. The fifth switch 312-5 is coupled between the amplifier input 308 and the first side 304-1 of the third transformer 302-3, and the sixth switch 312-6 is coupled between the amplifier output 310 and this first side 304-1. The eleventh switch 312-11 and the twelfth switch 312-12 are coupled between the second side 304-2 of the third transformer 302-3 and the plus and minus differential outputs RFout_p and RFout_m, respectively.

FIG. 4 is depicted with a single-ended amplifier, specifically the single-ended low-noise amplifier 122-1. However, this amplifier can be implemented as a differential low-noise amplifier. If so, the first side 304-1 of each transformer 302 of the set of transformers 126-1 can be implemented with a differential interface. In such cases, a quantity of switches coupled to the first side 304-1 of each transformer 302 is doubled from six (e.g., the six switches 312-1 to 312-6) to twelve. For example, in this situation, two lines couple the first side 304-1 of the first transformer 302-1 to both the amplifier input 308 and the amplifier output 310, which are both realized with plus and minus nodes here. In other implementations, at least one downstream component of the set of transformers 126-1 can be single-ended. If so, the second side 304-2 of each transformer 302 of the set of transformers 126-1 can be implemented with a single-ended interface. In such cases, a quantity of switches coupled to the second side 304-2 of each transformer 302 is halved from six (e.g., the six switches 312-7 to 312-12) to three. Further, both alternative implementations can be jointly realized such that the first side 304-1 of each transformer 302 is implemented with a differential interface and the second side 304-2 of each transformer 302 is implemented with a single-ended interface. In this circumstance, each transformer 302 can act as a balun that converts differential signaling on the first side 304-1 to single-ended signaling on the second side 304-2.

Although examples of the set of transformers 126 are depicted in FIGS. 3 and 4 as having two and three individual transformers, respectively, a set of transformers 126 may have four or more individual transformers. In some implementations, each individual transformer is tuned for a respective frequency band. Thus, a wireless transceiver with a set of transformers 126 that includes three transformers 302-1, 302-2 and 302-3 can process wireless signals across three different frequency bands using three respective propagation paths. This is described further with respect to FIG. 5.

Figure 5:
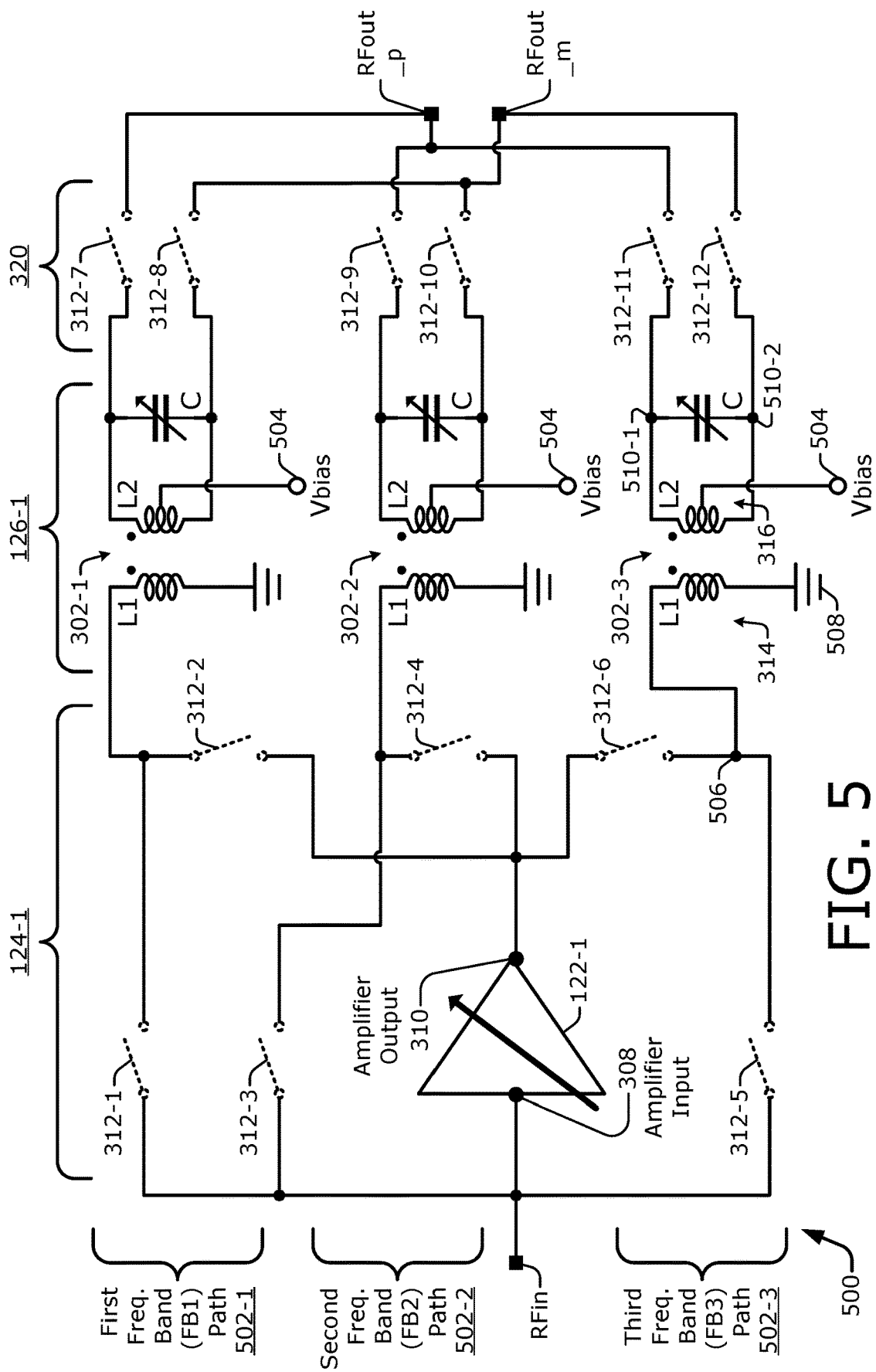
FIG. 5 is a circuit diagram illustrating an example wireless transceiver portion including an amplifier, switch circuitry, a set of transformers with three transformers, and differential switch circuitry.

FIG. 5 is a circuit diagram illustrating an example wireless transceiver portion 500 including an amplifier 122-1, switch circuitry 124-1, a set of transformers 126-1 with three transformers 302-1 to 302-3, and differential switch circuitry 320. Thus, the wireless transceiver portion 500 is similar to the wireless transceiver portion 400 of FIG. 4 with certain schematic components depicted with circuit components. For example, the single-ended low-noise amplifier 122-1 is depicted as a variable gain amplifier (VGA). The multiple switches 312-1 to 312-12 are illustrated using dashed lines to indicate an indeterminate state in FIG. 5. In contrast, each switch 312 is illustrated as being in a closed switch state or an open switch state in FIGS. 7-1 to 7-3 in accordance with a mode corresponding to a given frequency band.

Each of the first side 304-1 and the second side 304-2 (of FIGS. 3 and 4) can be implemented with at least one inductor as shown in FIG. 5 for each transformer 302. Here, each first side 304-1 is implemented as a first inductor (first inductor L1), and each second side 304-2 is implemented as a second inductor (second inductor L2). With reference to the third transformer 302-3 by way of example, the first inductor L1 is coupled between a single-ended node 506 and ground 508. This forms at least a portion of the single-ended interface 314. For the differential interface 316, the second inductor L2 is coupled between two differential nodes—a plus differential node 510-1 and a minus differential node 510-2. The plus differential node 510-1 and the minus differential node 510-2 can be selectively caused to correspond to the differential outputs RFout_p and RFout_m, respectively, using a pair of differential switches, which are the eleventh switch 312-11 and the twelfth switch 312-12 for the third transformer 302-3.

A capacitor C is also coupled between the two differential nodes in parallel with the second inductor L2. The second inductor L2 and the capacitor C form a capacitive-inductive tank (LC tank) that can tune a signal that transits the transformer. Accordingly, the capacitive and inductive values thereof can be selected based on a corresponding frequency band for signals to be processed by the associated transformer. Further, the tuning can be programmable by utilizing an adjustable capacitor C. The second inductor L2 can be biased using a voltage bias 504 (Vbias 504), which can be coupled to a tap—such as a center tap—of the second inductor L2. Generally, each transformer 302 has a first inductor L1 that is coupled between a respective single-ended node and the ground 508 and a second inductor L2 that is coupled between two differential nodes and in parallel with a respective adjustable capacitor C. Further respective pairs of differential switches can selectively couple a differential side of each respective transformer 302 (e.g., a respective differential interface 316) to the differential outputs RFout_p and RFout_m.

In some implementations, each respective transformer 302 is designed, fabricated, or tuned (e.g., via the adjustable capacitor C) to correspond to a respective frequency band. Thus, the first transformer 302-1 is tuned for a first frequency band (FB1) and forms a part of a first frequency band path 502-1. The second transformer 302-2 is tuned for a second frequency band (FB2) and forms a part of a second frequency band path 502-2. The third transformer 302-3 is tuned for a third frequency band (FB3) and forms a part of a third frequency band path 502-3. A receiver controller 214-1 (e.g., of FIGS. 2-4) can control the switches of the switch circuitry 124-1 and the differential switch circuitry 320 to reconfigure the transformers 302 such that at least one can be employed for output-loading for one frequency band and reused for input-matching for another frequency band with respect to the single-ended low-noise amplifier 122-1. This is described further with reference to FIGS. 6 and 7-1 to 7-3.

In FIG. 5, each transformer 302 of the set of transformers 126-1 is depicted as being switchably coupled to a same two nodes—e.g., the differential outputs RFout_p and RFout_m. This corresponds to the multiple transformers 302-1 to 302-3 sharing at least one single downstream component, such as a broadband differential low-noise amplifier or a broadband mixer. However, each transformer 302 of the set of transformers 126-1 may alternatively be coupled to a respective downstream component, such as a narrowband differential low-noise amplifier or a narrowband mixer. In other words, each of the multiple transformers 302-1 to 302-3 may be coupled to an individual portion of a downstream receive chain that extends from a respective transformer 302 along one or more components of a respective downstream receive chain.

In such cases, two transformers may be simultaneously accepting a signal from the single-ended low-noise amplifier 122-1 (e.g., two transformers may be activated for signal processing and output-loading) while another transformer provides input impedance-matching (e.g., while another transformer is engaged for impedance-matching with respect to the single-ended low-noise amplifier 122-1). For example, to engage the first transformer 302-1 for impedance-matching and to activate the second and third transformers 302-2 and 302-3, the six switches 312-1 to 312-6 can be placed in the following states. First, a receiver controller 214-1 (e.g., of FIGS. 2-4) places the first switch 312-1 in a closed switch state and the second switch state 312-2 in an open switch state for the first transformer 302-1. Second, the receiver controller 214-1 places the third switch 312-3 in an open switch state and the fourth switch state 312-4 in a closed switch state for the second transformer 302-2. Third, the receiver controller 214-1 places the fifth switch 312-5 in an open switch state and the sixth switch state 312-6 in a closed switch state for the third transformer 302-3.

Figure 6:
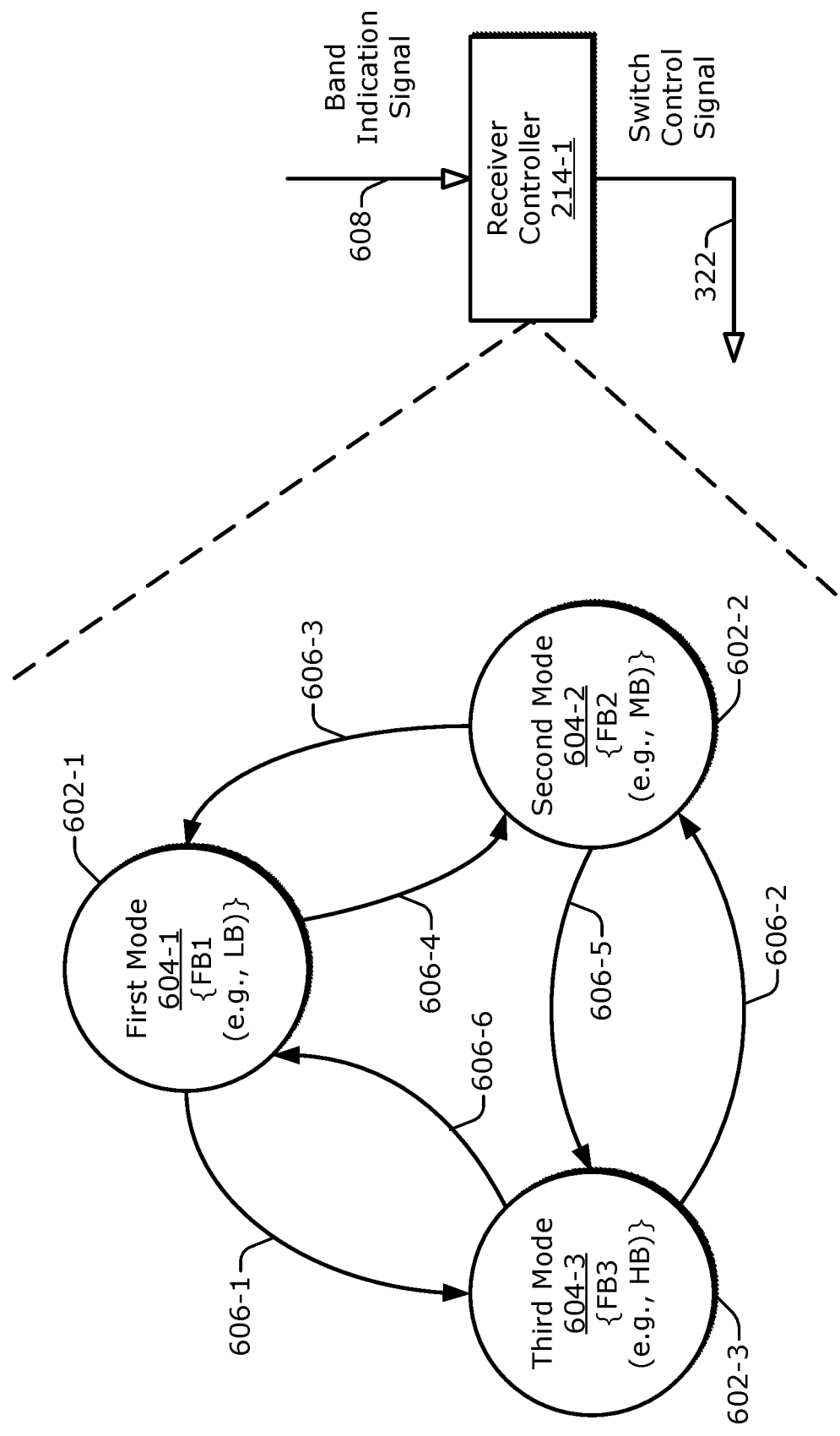
FIG. 6 illustrates an example state diagram having multiple states for a receiver controller to place the wireless transceiver portion of FIG. 5 in different modes of multiple modes.
Figures 1, 7:
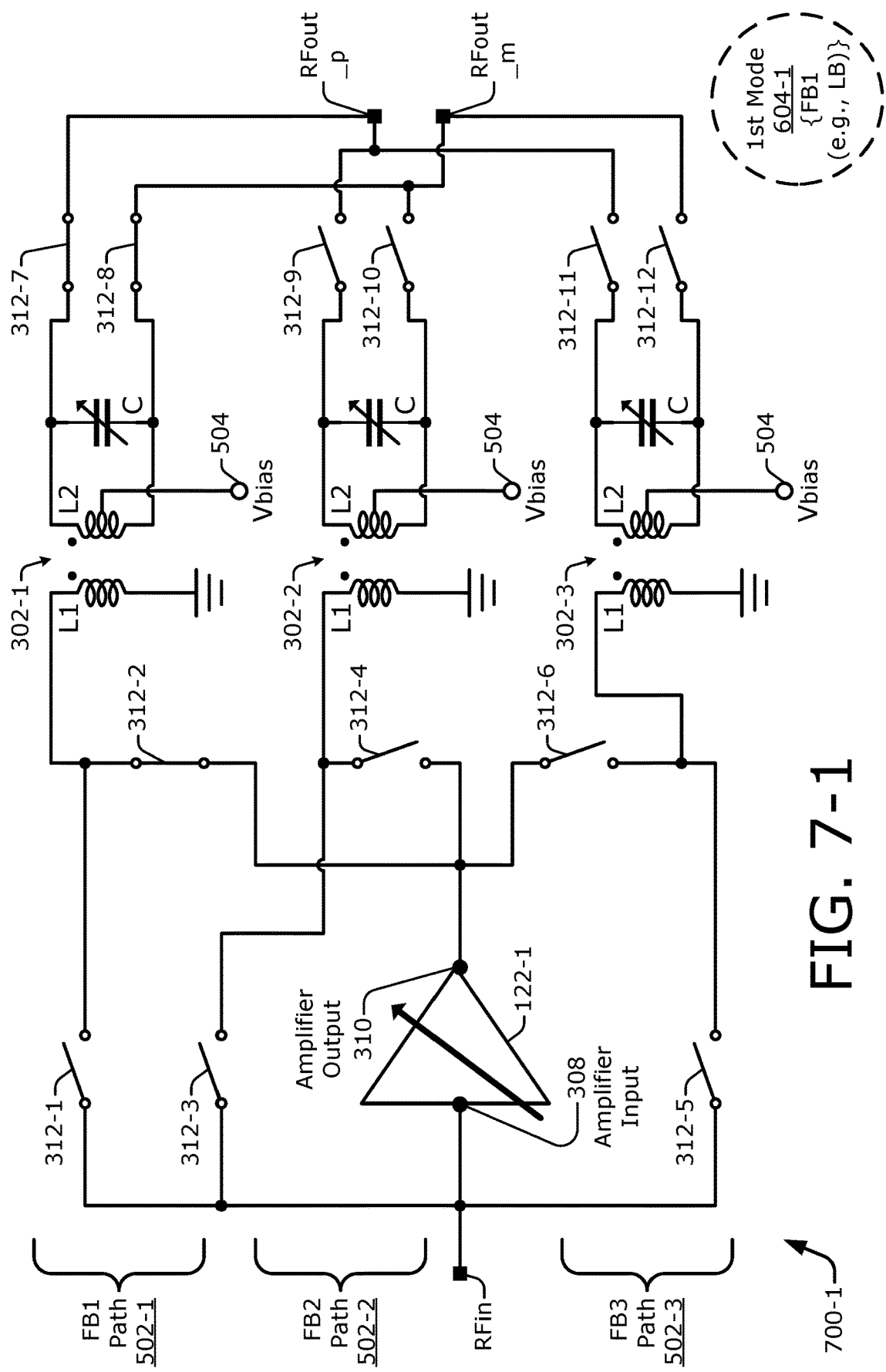
Figures 2, 7:
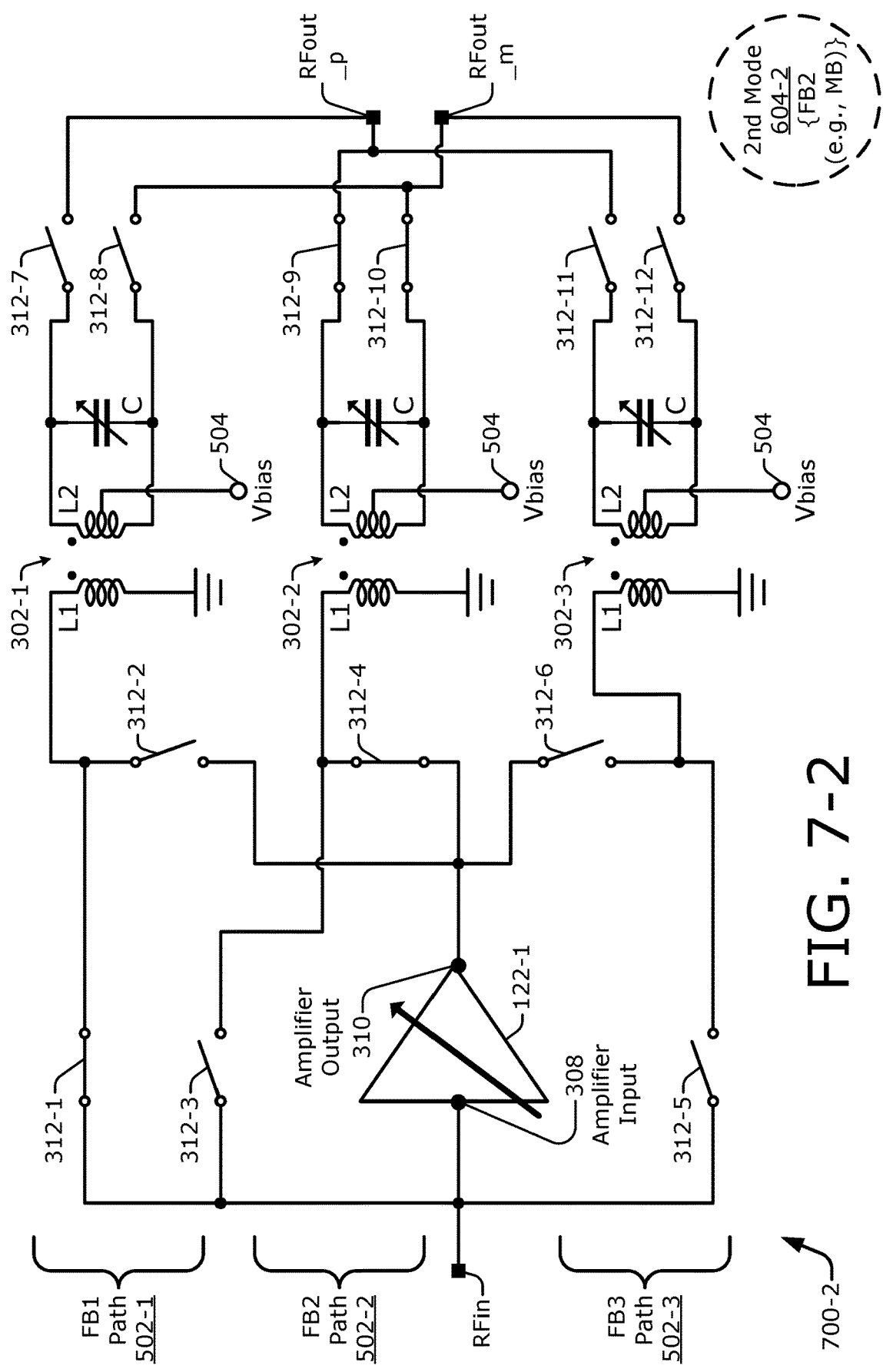
Figures 3, 7:
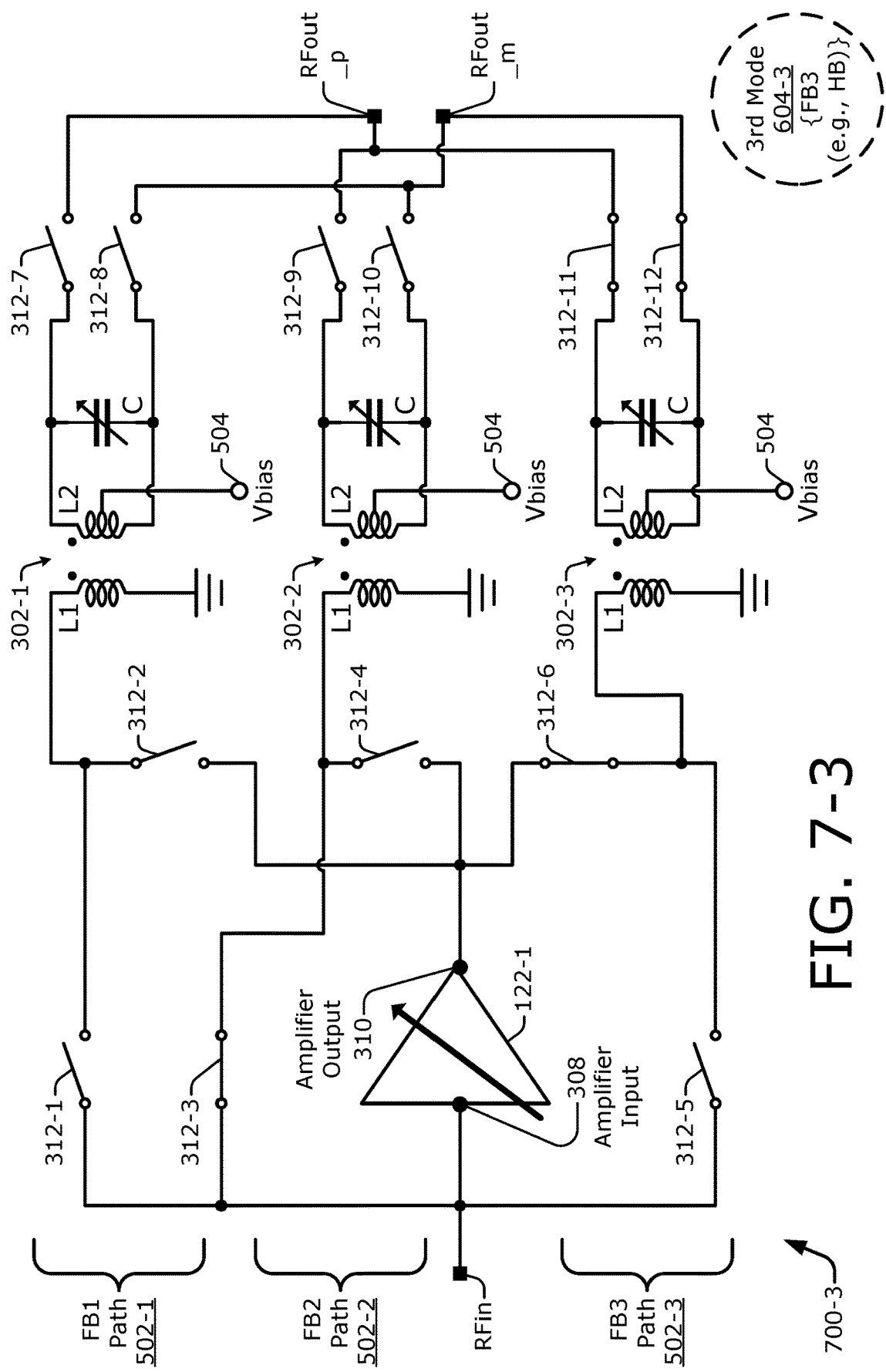

FIG. 6 illustrates an example state diagram 600 having multiple states for a receiver controller 214-1 for the wireless transceiver portion 500 of FIG. 5 and for those of FIGS. 7-1 to 7-3. The state diagram 600 includes three states 602-1 to 602-3 for the respective three transformers of the set of transformers 126-1 of FIG. 5. A first state 602-1 corresponds to a first mode 604-1 of operation at a first frequency band (FB1). A second state 602-2 corresponds to a second mode 604-2 of operation at a second frequency band (FB2). And a third state 602-3 corresponds to a third mode 604-3 of operation at a third frequency band (FB3). Generally, the receiver controller 214-1 can cause a receive chain 202 to enter one of the multiple states 602-1 to 602-3 responsive to reception of a wireless signal having a given frequency from multiple respective frequency bands.

As shown, the state diagram 600 includes six state transitions 606-1 to 606-6. The state transitions 606-3 and 606-6 lead to the first mode 604-1 from the second mode 604-2 and the third mode 604-3, respectively. The state transitions 606-4 and 606-2 lead to the second mode 604-2 from the first mode 604-1 and the third mode 604-3, respectively. The state transitions 606-1 and 606-5 lead to the third mode 604-3 from the first mode 604-1 and the second mode 604-2, respectively. Thus, the state transitions 606-3 and 606-6 are taken if a new incoming signal corresponds to the first frequency band (FB1) of the first mode 604-1 for the first state 602-1. Similarly, the state transitions 606-4 and 606-2 are taken if a new incoming signal corresponds to the second frequency band (FB2) of the second mode 604-2 for the second state 602-2. And the state transitions 606-1 and 606-5 are taken if a new incoming signal corresponds to the third frequency band (FB3) of the third mode 604-3 for the third state 602-3.

The receiver controller 214-1 implements one of the multiple modes 604-1 to 604-3 by opening and closing switches using the switch control signal 322. In example implementations, the receiver controller 214-1 can generate the switch control signal 322 based on a band indication signal 608. The band indication signal 608 is indicative of a current receiving or transmitting band, such as a first, second, or third frequency band. The first, second, and third frequency bands can respectively correspond to low, middle, and high frequency bands. In one example, the low-band (LB) corresponds to 1.7-2.2 GHz, the mid-band (MB) corresponds to 2.3-2.7 GHz, and the high-band (HB) corresponds to 3.4-3.8 GHz. However, there can be two or more than three frequency bands, and each frequency band can correspond to a different frequency range or ranges. Example switch states to realize the first through the third modes 604-1 to 604-3 with regard to the wireless transceiver portion 500 (of FIG. 5) are described below with reference to FIGS. 7-1 to 7-3, respectively.

FIG. 7-1 is a circuit diagram 700-1 of the wireless transceiver portion 500 of FIG. 5 in an example first mode 604-1 corresponding to a first frequency band (FB1) (e.g., a relatively low frequency band) with certain switches in associated switch states. The received signal is therefore to be routed along the first frequency band path 502-1. Accordingly, the receiver controller 214-1 (e.g., of FIG. 6) activates the first transformer 302-1 to process the received signal and couple the signal to a downstream component. In this example, for this first frequency band, no additional impedance matching is employed. Instead, the baseline components can be designed to achieve an acceptable level of impedance-matching for the first frequency band. Thus, the receiver controller 214-1 deactivates/disengages the second and third transformers 302-2 and 302-3.

To achieve these activation and deactivations, the receiver controller 214-1 generates at least one switch control signal 322 to close the second switch 312-2 and the seventh and eighth switches 312-7 and 312-8. The at least one switch control signal 322 further opens the other nine switches, namely the first switch 312-1, the third through sixth switches 312-3 to 312-6, and the ninth through twelfth switches 312-9 to 312-12. Consequently, a propagating signal can flow through the single-ended low-noise amplifier 122-1 from the amplifier input 308 to the amplifier output 310, be routed to the first inductor L1 of the first transformer 302-1 via the second switch 312-2 being in a closed state, transit the first transformer 302-1, and be routed to the differential outputs RFout_p and RFout_m over the seventh and eighth switches 312-7 and 312-8.

FIG. 7-2 is a circuit diagram 700-2 of the wireless transceiver portion 500 of FIG. 5 in an example second mode 604-2 corresponding to a second frequency band (FB2) (e.g., a relatively in-the-middle frequency band) with certain switches in associated switch states. The received signal is therefore to be routed along the second frequency band path 502-2. Accordingly, the receiver controller 214-1 (e.g., of FIG. 6) activates the second transformer 302-2 to process the received signal and couple the signal to a downstream component. In this example, for this second frequency band, additional impedance-matching is employed by engaging the first transformer 302-1 to reuse the inductance thereof (e.g., to reuse the first inductor L1 or the first inductor L1 in conjunction with the second inductor L2 of the first transformer 302-1). This provides input impedance-matching for the single-ended low-noise amplifier 122-1 at the amplifier input 308. The receiver controller 214-1 also deactivates/disengages the third transformer 302-3 for the second mode 604-2.

To achieve the activation, engagement, and deactivation of these three transformers, the receiver controller 214-1 generates at least one switch control signal 322 to control switch states of the twelve switches. Specifically, the receiver controller 214-1 closes the first switch 312-1 to couple the inductor L1 of the first transformer 302-1 to the amplifier input 308 and opens the second switch 312-2 as well as the seventh and eighth switches 312-7 and 312-8. This engages the first transformer 302-1 to provide input impedance-matching. The at least one switch control signal 322 also opens the third switch 312-3 and closes the fourth switch 312-4 as well as the ninth and tenth switches 312-9 and 312-10. This activates the second transformer 302-2 for signal processing and forwarding of the signal to another component (e.g., the differential receiver component 318 of FIG. 3).

The receiver controller 214-1 further opens the remaining four switches, namely both the fifth and sixth switches 312-5 and 312-6 and both the eleventh and twelfth switches 312-11 and 312-12. Opening these four switches deactivates and disengages the third transformer 302-3. Consequently, a propagating signal can flow through the single-ended low-noise amplifier 122-1 from the amplifier input 308 to the amplifier output 310, be routed to the first inductor L1 of the second transformer 302-2 via the fourth switch 312-4 being in a closed state, transit the second transformer 302-2, and be routed to the differential outputs RFout_p and RFout_m over the ninth and tenth switches 312-9 and 312-10.

FIG. 7-3 is a circuit diagram 700-3 of the wireless transceiver portion 500 of FIG. 5 in an example third mode 604-3 corresponding to a third frequency band (FB3) (e.g., a relatively high frequency band) with certain switches in associated switch states. The received signal is therefore to be routed along the third frequency band path 502-3. Accordingly, the receiver controller 214-1 (e.g., of FIG. 6) activates the third transformer 302-3 to process the received signal and couple the signal to a downstream component. In this example, for this third frequency band, additional impedance-matching is employed by engaging the second transformer 302-2 to reuse the inductance thereof (e.g., to reuse the first inductor L1 or the first inductor L1 in conjunction with the second inductor L2 of the second transformer 302-2). This provides input impedance-matching for the single-ended low-noise amplifier 122-1 at the amplifier input 308 for the third mode 604-3. The receiver controller 214-1 also deactivates/disengages the first transformer 302-1 for the third mode 604-3.

To achieve the activation, engagement, and deactivation of these three transformers, the receiver controller 214-1 generates at least one switch control signal 322 to control switch states of the twelve switches. Specifically, the receiver controller 214-1 closes the third switch 312-3 to couple the inductor L1 of the second transformer 302-2 to the amplifier input 308 and opens the fourth switch 312-4 as well as the ninth and tenth switches 312-9 and 312-10. This engages the second transformer 302-2 to provide input impedance-matching. The at least one switch control signal 322 also opens the fifth switch 312-5 and closes the sixth switch 312-6 as well as the eleventh and twelfth switches 312-11 and 312-12. This activates the third transformer 302-3 for signal processing and forwarding of the signal to another component (e.g., to the differential receiver component 318 of FIG. 3).

The receiver controller 214-1 further opens the remaining four switches, namely both the first and second switches 312-1 and 312-2 and both the seventh and eighth switches 312-7 and 312-8. Opening these four switches deactivates and disengages the first transformer 302-1 of the set of transformers. Consequently, a propagating signal can flow through the single-ended low-noise amplifier 122-1 from the amplifier input 308 to the amplifier output 310, be routed to the first inductor L1 of the third transformer 302-3 via the sixth switch 312-6 being in a closed state, transit the third transformer 302-3, and be routed to the differential outputs RFout_p and RFout_m over the eleventh and twelfth switches 312-11 and 312-12.

By implementing these different configurations or modes of FIGS. 7-1 to 7-3 responsive to different frequencies of received signals, the receiver controller 214-1 (e.g., of FIG. 6) can provide an example activation mechanism for activating a transformer 302 of the set of transformers 126-1 to provide output-loading for the single-ended low-noise amplifier 122-1 and to process a received signal responsive to a given frequency band. Additionally or alternatively, the receiver controller 214-1 can provide an example engagement mechanism for engaging another transformer 302 of the set of transformers 126-1 to provide input-matching for the single-ended low-noise amplifier 122-1 responsive to the given frequency band. In other implementations, a transmitter controller 214-2 can provide analogous mechanisms with respect to a single-ended power amplifier 122-2.

Figure 8:
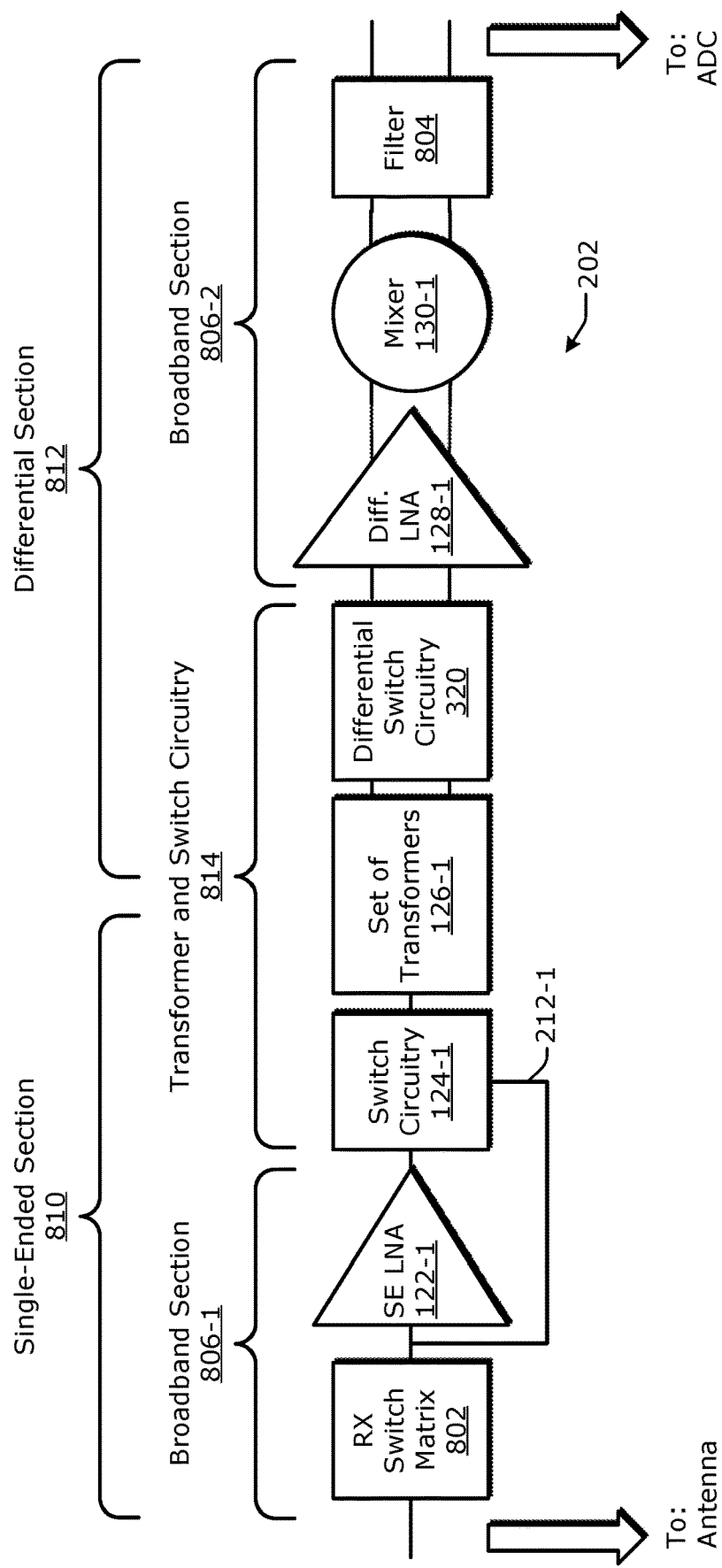
FIG. 8 is a schematic diagram illustrating another example implementation of a wireless transceiver portion.

FIG. 8 is a schematic diagram illustrating another example wireless transceiver portion 800. The wireless transceiver portion 800 includes an alternative receive chain 202. From the left, a receiver switch matrix 802 (RX Switch Matrix 802) leads to at least one antenna, such as the antenna 136 of FIG. 2. The receiver switch matrix 802 is coupled to the single-ended low-noise amplifier 122-1, which is coupled to transformer and switch circuitry 814. The transformer and switch circuitry 814 is coupled to the differential low-noise amplifier 128-1, which is coupled to the mixer 130-1. A filter 804 is coupled to the mixer 130-1 and leads to an analog-to-digital converter (ADC), such as the analog-to-digital converter 132-1 of FIG. 2.

As illustrated, the transformer and switch circuitry 814 includes the switch circuitry 124-1, the set of transformers 126-1, and the differential switch circuitry 320. As shown in, e.g., FIGS. 3-5, the set of transformers 126-1 includes multiple individual transformers 302-1 to 302-3. The transformers 302-1 to 302-3 convert single-ended signals to differential signals in the receive chain 202. Thus, a portion of the receive chain 202 to the left of the set of transformers 126-1 is indicated as a single-ended section 810, and another portion of the receive chain 202 to the right of the set of transformers 126-1 is indicated as a differential section 812. Further, each respective transformer 302 of the set of transformers 126-1 corresponds to, and is configured to process signals for, a respective frequency band. In this sense, each individual transformer 302 can be implemented as a narrowband component.

In contrast, other components can correspond to, and can be configured to process signals for, multiple frequency bands, such as low, middle, and high frequency bands. Accordingly, these other components can be implemented as broadband components. These other components are indicated as being part of a first broadband section 806-1 (to the left of the transformer and switch circuitry 814) or a second broadband section 806-2 (to the right of the transformer and switch circuitry 814) of the receive chain 202. Thus, the single-ended low-noise amplifier 122-1, the differential amplifier 128-1, the mixer 130-1, and the filter 804—or any combination thereof—can be implemented as a respective broadband component to further save space within the wireless transceiver.

FIG. 9 is a flow diagram illustrating an example process 900 for operating a wireless transceiver with reconfigurable transformers. The process 900 is described in the form of a set of blocks 902-908 that specify operations that can be performed. However, operations are not necessarily limited to the order shown in FIG. 9 or described herein, for the operations may be implemented in alternative orders or in fully or partially overlapping manners. Operations represented by the illustrated blocks of the process 900 may be performed by a wireless transceiver 120 (e.g., of FIG. 1 or 2). More specifically, the operations of the process 900 may be performed by a receive chain 202, including by switch circuitry 124, a set of transformers 126, or a transceiver controller 214 (e.g., of FIGS. 2 and 3). In alternative implementations, analogous operations can be performed by a transmit chain 204 with respect to a single-ended power amplifier 122-2.

At block 902, a first switch is selectively closed or opened to respectively connect or disconnect a first side of a first transformer to or from an amplifier input of a low-noise amplifier (LNA) of a wireless transceiver. For example, a receiver controller 214-1 can selectively close or open a first switch 312-1 to respectively connect or disconnect a first side 304-1 of a first transformer 302-1 to or from an amplifier input 308 of a single-ended low-noise amplifier 122-1 of a wireless transceiver 120. For instance, to engage the first transformer 302-1 to provide input impedance-matching, the receiver controller 214-1 may close the first switch 312-1 to couple a first inductor L1 of the first side 304-1 to the amplifier input 308.

At block 904, a second switch is selectively closed or opened to respectively connect or disconnect the first side of the first transformer to or from an amplifier output of the low-noise amplifier. For example, the receiver controller 214-1 can selectively close or open a second switch 312-2 to respectively connect or disconnect the first side 304-1 of the first transformer 302-1 to or from an amplifier output 310 of the single-ended low-noise amplifier 122-1. This may be performed by biasing a transistor that implements the second switch 312-2 to substantially prevent current flow from the amplifier output 310 to the first side 304-1 of the first transformer 302-1.

At block 906, a third switch is selectively closed or opened to respectively connect or disconnect a first side of a second transformer to or from the amplifier input of the low-noise amplifier. For example, the receiver controller 214-1 can selectively close or open a third switch 312-3 to respectively connect or disconnect a first side 304-1 of a second transformer 302-2 to or from the amplifier input 308 of the single-ended low-noise amplifier 122-1. To activate the second transformer 302-2 to provide output-loading (e.g., but not impedance-matching) for the single-ended low-noise amplifier 122-1, the receiver controller 214-1 may open the third switch 312-3 to separate a first inductor of the first side 304-1 of the second transformer 302-2 from the amplifier input 308.

At block 908, a fourth switch is selectively closed or opened to respectively connect or disconnect the first side of the second transformer to or from the amplifier output of the low-noise amplifier. For example, the single-ended low-noise amplifier 122-1 can selectively close or open a fourth switch 312-4 to respectively connect or disconnect the first side 304-1 of the second transformer 302-2 to or from the amplifier output 310 of the single-ended low-noise amplifier 122-1. To activate the second transformer 302-2 to provide output-loading and to process a signal having a frequency that corresponds to the second transformer 302-2, the receiver controller 214-1 may close the fourth switch 312-4 to couple the first inductor L1 of the first side 304-1 of the second transformer 302-2 to the amplifier output 310 of the single-ended low-noise amplifier 122-1.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus with reconfigurable transformers, the apparatus comprising:
    a set of transformers including:
        a first transformer having a first side and a second side; and
        a second transformer having a first side and a second side;
    an amplifier including an amplifier input and an amplifier output; and
    switch circuitry coupled between the set of transformers and the amplifier, the switch circuitry including:
        a first switch coupled between the amplifier input and the first side of the first transformer;
        a second switch coupled between the amplifier output and the first side of the first transformer;
        a third switch coupled between the amplifier input and the first side of the second transformer; and
        a fourth switch coupled between the amplifier output and the first side of the second transformer.

2. The apparatus of claim 1, wherein:
    the set of transformers includes a third transformer having a first side and a second side; and
    the switch circuitry includes:
        a fifth switch coupled between the amplifier input and the first side of the third transformer; and
        a sixth switch coupled between the amplifier output and the first side of the third transformer.

3. The apparatus of claim 1, wherein the amplifier comprises a low-noise amplifier (LNA).

4. The apparatus of claim 1, further comprising:
    an antenna coupled to the amplifier input of the amplifier; and
    a receiver,
    wherein the receiver includes the set of transformers, the amplifier, and the switch circuitry.

5. The apparatus of claim 1, wherein:
    the first side of the first transformer includes a primary inductor;
    the second side of the first transformer includes a secondary inductor;
    the first side of the second transformer includes another primary inductor; and
    the second side of the second transformer includes another secondary inductor.

6. The apparatus of claim 1, wherein:
the first side of the first transformer comprises a single-ended interface;
the second side of the first transformer comprises a differential interface;
the first side of the second transformer comprises another single-ended interface; and
the second side of the second transformer comprises another differential interface.

7. The apparatus of claim 6, further comprising:
differential switch circuitry; and
a differential receiver component, wherein:
the amplifier comprises a single-ended amplifier;
the switch circuitry is configured to selectively couple the amplifier input and the amplifier output of the single-ended amplifier to the single-ended interface of the first side of the first transformer or to the other single-ended interface of the first side of the second transformer; and
the differential switch circuitry is configured to selectively couple the differential receiver component to the differential interface of the second side of the first transformer or to the other differential interface of the second side of the second transformer.

8. The apparatus of claim 7, wherein the differential receiver component comprises at least one of a differential amplifier, a differential mixer, or a differential filter.

9. The apparatus of claim 1, wherein:
the first transformer and the second transformer are coupled together in parallel; and
the first transformer is tuned for a first frequency band, and the second transformer is tuned for a second frequency band.

10. The apparatus of claim 9, further comprising:
a receiver controller coupled to the switch circuitry,
wherein the receiver controller is, responsive to a received signal having a frequency within the second frequency band, configured to:
activate the second transformer at the amplifier output to provide output-loading and to process the received signal; and
engage the first transformer at the amplifier input to provide input impedance-matching.

11. The apparatus of claim 10, wherein the second frequency band is relatively higher than the first frequency band.

12. The apparatus of claim 1, further comprising:
a receiver controller coupled to the switch circuitry,
wherein the receiver controller is configured to selectively activate the second transformer as an output-loading transformer for the amplifier at one time and to selectively engage the second transformer as an input-matching transformer for the amplifier at another time.

13. The apparatus of claim 1, further comprising:
a receiver controller coupled to the switch circuitry,
wherein the receiver controller is configured, responsive to a reception in a second frequency band corresponding to the second transformer, to operate the switch circuitry to:
close the first switch and open the second switch; and
open the third switch and close the fourth switch.

14. The apparatus of claim 13, wherein the receiver controller is configured, responsive to the reception in the second frequency band, to operate the switch circuitry to:
close the first switch and open the second switch to respectively connect the first transformer to the amplifier input and disconnect the first transformer from the amplifier output; and
open the third switch and close the fourth switch to respectively disconnect the second transformer from the amplifier input and connect the second transformer to the amplifier output.

15. The apparatus of claim 13, wherein the receiver controller is configured, responsive to another reception in a first frequency band corresponding to the first transformer, to operate the switch circuitry to:
open the first switch and close the second switch; and
open the third switch and the fourth switch.

16. A system comprising:
a set of transformers including:
a first transformer having a first side and a second side; and
a second transformer having a first side and a second side;
a low-noise amplifier (LNA) including an amplifier input and an amplifier output; and
switching means for selectively connecting the first side of the first transformer to the amplifier input or the amplifier output and for selectively connecting the first side of the second transformer to the amplifier input or the amplifier output.

17. The system of claim 16, further comprising:
control means for configuring the first transformer and the second transformer in multiple modes corresponding to multiple frequency bands using the switching means, wherein
the multiple frequency bands include a first frequency band and a second frequency band;
the first transformer is tuned for the first frequency band;
the second transformer is tuned for the second frequency band; and
the control means is configured to cause the switching means to:
for the first frequency band, couple the first side of the first transformer to the amplifier output; and
for the second frequency band, couple the first side of the second transformer to the amplifier output and the first side of the first transformer to the amplifier input.

18. The system of claim 16, wherein the switching means comprises:
activation means for activating a transformer of the set of transformers to provide output-loading for the LNA and to process a received signal responsive to a given frequency band; and
engagement means for engaging another transformer of the set of transformers to provide input-matching for the LNA responsive to the given frequency band.

19. A method for operating a wireless transceiver with reconfigurable transformers, the method comprising:
selectively closing or opening a first switch to respectively connect or disconnect a first side of a first transformer to or from an amplifier input of a low-noise amplifier (LNA) of the wireless transceiver;
selectively closing or opening a second switch to respectively connect or disconnect the first side of the first transformer to or from an amplifier output of the LNA;
selectively closing or opening a third switch to respectively connect or disconnect a first side of a second transformer to or from the amplifier input of the LNA; and
selectively closing or opening a fourth switch to respectively connect or disconnect the first side of the second transformer to or from the amplifier output of the LNA.

20. The method of claim 19, wherein the method is performed responsive to a frequency band associated with a received signal.

21. The method of claim 19, wherein, responsive to a reception in a first frequency band corresponding to the first transformer:
the selectively closing or opening of the first switch includes opening the first switch to disconnect the first side of the first transformer from the amplifier input of the LNA;
the selectively closing or opening of the second switch includes closing the second switch to connect the first side of the first transformer to the amplifier output of the LNA;
the selectively closing or opening of the third switch includes opening the third switch to disconnect the first side of the second transformer from the amplifier input of the LNA; and
the selectively closing or opening of the fourth switch includes opening the fourth switch to disconnect the first side of the second transformer from the amplifier output of the LNA.

22. The method of claim 19, wherein, responsive to a reception in a second frequency band corresponding to the second transformer:
the selectively closing or opening of the first switch includes closing the first switch to connect the first side of the first transformer to the amplifier input of the LNA;
the selectively closing or opening of the second switch includes opening the second switch to disconnect the first side of the first transformer from the amplifier output of the LNA;
the selectively closing or opening of the third switch includes opening the third switch to disconnect the first side of the second transformer from the amplifier input of the LNA; and
the selectively closing or opening of the fourth switch includes closing the fourth switch to connect the first side of the second transformer to the amplifier output of the LNA.

23. The method of claim 19, further comprising:
selectively closing or opening a fifth switch to respectively connect or disconnect a first side of a third transformer to or from the amplifier input of the LNA; and
selectively closing or opening a sixth switch to respectively connect or disconnect the first side of the third transformer to or from the amplifier output of the LNA.

24. The method of claim 23, wherein, responsive to a reception in a third frequency band corresponding to the third transformer:
the selectively closing or opening of the first switch includes opening the first switch to disconnect the first side of the first transformer from the amplifier input of the LNA;
the selectively closing or opening of the second switch includes opening the second switch to disconnect the first side of the first transformer from the amplifier output of the LNA;
the selectively closing or opening of the third switch includes closing the third switch to connect the first side of the second transformer to the amplifier input of the LNA;
the selectively closing or opening of the fourth switch includes opening the fourth switch to disconnect the first side of the second transformer from the amplifier output of the LNA;
the selectively closing or opening of the fifth switch includes opening the fifth switch to disconnect the first side of the third transformer from the amplifier input of the LNA; and
the selectively closing or opening of the sixth switch includes closing the sixth switch to connect the first side of the third transformer to the amplifier output of the LNA.

25. The method of claim 19, further comprising, responsive to a reception in a first frequency band corresponding to the first transformer:
activating the first transformer to provide output-loading for the LNA and to process a received signal; and
disengaging the second transformer from providing input-matching for the LNA.

26. The method of claim 19, further comprising, responsive to a reception in a second frequency band corresponding to the second transformer:
engaging the first transformer to provide input-matching for the LNA; and
activating the second transformer to provide output-loading for the LNA and to process a received signal.

27. A wireless transceiver comprising:
an amplifier including an amplifier input and an amplifier output;
a set of transformers including:
a first transformer including a first inductor and a second inductor; and
a second transformer including a first inductor and a second inductor; and
switch circuitry configured to switchably couple the set of transformers via the first inductor of each transformer to the amplifier input and the amplifier output of the amplifier.

28. The wireless transceiver of claim 27, wherein:
the amplifier comprises a single-ended low-noise amplifier;
the first transformer includes a single-ended interface corresponding to the first inductor of the first transformer;
the first transformer includes a differential interface corresponding to the second inductor of the first transformer;
the second transformer includes another single-ended interface corresponding to the first inductor of the second transformer; and
the second transformer includes another differential interface corresponding to the second inductor of the second transformer.

29. The wireless transceiver of claim 27, wherein the switch circuitry includes:
a first switch coupled between the amplifier input and the first inductor of the first transformer; and
a second switch coupled between the amplifier output and the first inductor of the first transformer.

30. The wireless transceiver of claim 27, further comprising:
a transceiver controller coupled to the switch circuitry, wherein the transceiver controller is configured, for a signal in a frequency band corresponding to the second transformer, to operate the switch circuitry to:

connect the first inductor of the first transformer to the amplifier input and disconnect the first inductor of the first transformer from the amplifier output; and
disconnect the first inductor of the second transformer from the amplifier input and connect the first inductor of the second transformer to the amplifier output.

* * * * *